US009263609B2

(12) United States Patent
Kühnlein et al.

(10) Patent No.: US 9,263,609 B2
(45) Date of Patent: Feb. 16, 2016

(54) METAL PLATING COMPOSITION AND METHOD FOR THE DEPOSITION OF COPPER—ZINC—TIN SUITABLE FOR MANUFACTURING THIN FILM SOLAR CELL

(75) Inventors: Holger Kühnlein, Vörstetten (DE); Jörg Schulze, Oranienburg (DE); Torsten Voss, Glienicke (DE)

(73) Assignee: Atotech Deutschland GmbH, Berlin (DE)

( * ) Notice: Subject to any disclaimer, the term of this patent is extended or adjusted under 35 U.S.C. 154(b) by 1496 days.

(21) Appl. No.: 12/302,072

(22) PCT Filed: May 15, 2007

(86) PCT No.: PCT/EP2007/004553
§ 371 (c)(1),
(2), (4) Date: Dec. 31, 2008

(87) PCT Pub. No.: WO2007/134843
PCT Pub. Date: Nov. 29, 2007

(65) Prior Publication Data
US 2009/0205714 A1 Aug. 20, 2009

(30) Foreign Application Priority Data

May 24, 2006 (EP) ..................... 06090086

(51) Int. Cl.
*C25D 3/58* (2006.01)
*H01L 31/032* (2006.01)
*C23C 18/40* (2006.01)
*C23C 18/48* (2006.01)
*C25D 5/10* (2006.01)
*C25D 5/48* (2006.01)
*H01L 31/06* (2012.01)

(52) U.S. Cl.
CPC ............ *H01L 31/0322* (2013.01); *C23C 18/40* (2013.01); *C23C 18/48* (2013.01); *C25D 3/58* (2013.01); *C25D 5/10* (2013.01); *C25D 5/48* (2013.01); *H01L 31/06* (2013.01); *Y02E 10/541* (2013.01)

(58) Field of Classification Search
USPC .................. 205/239, 240, 241, 155, 154, 244; 106/1.26, 1.29, 1.18, 1.23
See application file for complete search history.

(56) References Cited

U.S. PATENT DOCUMENTS

| 2,435,967 | A | 2/1948 | Jernstedt | |
|---|---|---|---|---|
| 2,530,967 | A | 11/1950 | Jernstedt | |
| 5,730,852 | A | 3/1998 | Bhattacharya et al. | |
| 5,762,778 | A * | 6/1998 | Ameen et al. ............... | 205/240 |
| 6,475,640 | B1 | 11/2002 | Doujak et al. | |
| 6,508,927 | B2 | 1/2003 | Yanada et al. | |
| 2002/0104763 | A1 * | 8/2002 | Yanada et al. ............... | 205/241 |
| 2004/0043153 | A1 * | 3/2004 | Okuhama et al. ............ | 427/307 |
| 2004/0118696 | A1 | 6/2004 | Zhang et al. | |
| 2005/0263403 | A1 * | 12/2005 | Zschintzsch et al. ........ | 205/241 |
| 2006/0137991 | A1 | 6/2006 | Zschintzsch et al. | |

FOREIGN PATENT DOCUMENTS

| EP | 1001054 A2 | 5/2000 |
|---|---|---|
| EP | 1400613 A2 | 3/2004 |
| EP | 1439238 A | 7/2004 |
| GB | 146 5169 | 2/1977 |
| JP | 63206494 A | 8/1998 |
| JP | 200126898 A | 1/2001 |
| JP | 2004263291 A | 9/2002 |
| SU | 1177400 A | 9/1985 |
| SU | 1236010 A1 | 6/1986 |

OTHER PUBLICATIONS

Katagiri, Thin Solid Films, 480-481, 426-432 (2005).*
Friedlmeier et al., Inst. Phys. Conf. Ser. No. 152: Section B: Thin Film Growth and Characterization, 345-348 (1997).*
J.Cl. Puippe, "Optalloy—eine elektrolytisch hergestellte Cu—Zn—Sn-Legierung", Galvanotechnik, 76 (1985), 536-441. Relevance is that it was cited on p. 4 of the instant application.
T.A.M.Friedlmeier, Multinary Compounds and Alloys for Thin-Film Solar Cells: Cu2ZnSnS4 and Cu(In,Ga)(S,Se)f, Fortschr.-Ber. VDI, Reihe 9, Nr, 340, VDI-Verlag, Düsseldorf (2001).
Katagiri et al., "Solar Cell Without Environmental Pollution by Using CZTS Thin Films", Proceedings of 3rd World Conference on Photovoltaic Energy Conversion, vol. 3, pp. 2874-2879, 2003.
B. Volk et al., Development of Lead-Free Copper for Electrical Applications, AFS Transactions, p. 261-272.
Fritz H. P. et al.: "A New Electromechanical Method for Selenization of Stacked CuIn Layers and Preparation of CuInSe2 by Thermal Annealing", Thin Solid Films, Elsevier-Sequoia S.A. Lausanne, CH, vol. 247, No. 1, Jul. 1, 1994, pp. 129-133, XP000454904, ISSN: 0040-6090.
Adurodija F. O. et al.: "Preparation of CuInSe2 Thin Films by Selenization of Co-Sputtered Cu—In Precursors", Journal of Materials Science. Materials in Electronics, Chapman and Hall, Londong, GB, vol. 9, No. 5, Oct. 1, 1998, pp. 361-366, XP000824180, ISSN: 0957-4522.
Thomas Hammann "Optische Charakterisierung von multinaren Verbindungshalbleitern", Studienarbeit (online) 1998, pp. 1-2, XP 002528722.
Koh et al. "Investigation of the effects of by product components in Cu plating for advanced interconnect metallization" Microelectronics Journal vol. 33 No. 1, Jan. 3, 2002 pp. 229-234, XP 004335852.
Taunier S. et al.: "Cu (In, Ga)(S, Se)2 solar cells and modules by electrodeposition Thin Solid Films" vol. 480-481 Jan. 6, 2005, pp. 526-531, XP 025387507.

(Continued)

*Primary Examiner* — Monique Peets
(74) *Attorney, Agent, or Firm* — Paul & Paul

(57) ABSTRACT

To be able to form a copper-zinc-tin alloy which optionally comprises at least one chalcogenide and thus forms a semiconductor without the use of toxic substances a metal plating composition for the deposition of a copper-zinc-tin alloy is disclosed, wherein said metal plating composition comprises at least one copper plating species, at lease one zinc plating species, at least one tin plating species and at least one complexing agent and further, if the alloy contains at least one chalcogen, at least one chalcogen plating species.

19 Claims, 7 Drawing Sheets

(56) References Cited

OTHER PUBLICATIONS

H.Katagiri et at, "Development of Thin Film Solar Cell Based on Cu2ZnSnS4 Thin Films", Solar Energy Mat. & Solar Cells, 65 (2001), 141-148.

H. Katagiri, "Cu2ZnSnS4 Thin Film Solar Cells", Thin Solid Films, 480-481 (2005), 426-432; / XP 002478978.

3. K. Ito et at, "Electrical and Optical Properties of Stannite-Type Quarternary Semiconductor Thin Films", Jap. J. Appl. Phys., 27 (11)(1988), 2094-2097.

N. Nakayama et al., "Sprayed Films of Stannite Cu2ZnSnS4", Appl. Surf. Sci., 92 (1996), 171-175.

J,Madarasz et at, "Thermal Decomposition of Thiourea Complexes of CuU), Zn(II) and Sn(II) Chlorides as Precursors for the Spray Pyrolysis Deposition of Sulfide Thin Films", Solid State Ionics, 141-142 (2001), 439-446.

J.-S. Seol et al., "Electrical and Optical Properties of Cu2ZnSnS4 Thin Films Prepared by RFMagnetron Sputtering Process", Solar Energy Mat, & Solar Cells, 75 (2003),155-162.

Th.M. Friedlmeier et al., "Growth and Characterization of Cu2ZnSnS4 and Cu2ZnSnSe4 thin Films for Photovoltaic Applications", Inst. Phys. Conf. Ser. No. 152: Sec. B: Thin Film Growth and Characterization (1998), 345-348.

Metals Handbook, American Society for Metals, 9th ed. (1993), USA.

G.F-Jacky, "Electroplating a Copper—Tin—Zinc Alloy", Plating 58 (1971), 883-887.

J.Cl. Puippe, "Optalloy—eine elektrolytisch hergestellte Cu—Zn—Sn-Legierung", Galvanotechnik, 76 (1985), 536-441.

R.Jurczok et al, "Anwendungstechnische Eigenschaften von galvanischen KupferZinn-Zink-Schichten in der Elektroindustrie", Metalloberflache, 39 (1985), 201-203). Relevance is that is was cited on p. 5 of the instant application. Relevance is that is was cited on p. 5 of the instant application.

L. Picincu et al, "Electrochemistry of the SUCOPLATE® Electroplating Bath for the Deposition of Cu—Zn—Sn alloy; Part H: Influence of the Concentration of Bath Components", J. Appi. Electrochem., 31(2001), 395-402.

K.Moriya et al, "Characterization of Cu2ZnSnS4 Thin Films Prepared by Photo-Chemical Deposition", Jap. J. Appl. Phys., 44 (1 B9 (2005), 515-717.

TltM-Friedlmeier, Multinary Compounds and Alloys for Thin-Film Solar Cells: Cu2ZnSnS4 and Cu(In,Ga)(S,Se)f, Fortschr.-Ber. VDI, Reihe 9, Nr, 340, VDI-Verlag, Düsseldorf (2001).

H. Katagiri et al., "Preparation and Evaluation of Cu2ZnSnS4 Thin Films by Sulfurization", Solar Energy Mat. & Solar Cells, 49 (1997) 407-414.

\* cited by examiner

METAL PLATING COMPOSITION AND METHOD FOR THE DEPOSITION OF COPPER—ZINC—TIN SUITABLE FOR MANUFACTURING THIN FILM SOLAR CELL

FIELD OF THE INVENTION

The present invention relates to a copper-zinc-tin alloy, a metal plating composition and method for the deposition thereof, a method of preparing a sandwich layer and a thin film solar cell comprising the copper-zinc-tin alloy as a p-type absorber layer. A $Cu_xZn_ySn_z$ alloy layer particularly serves as a precursor of well-defined stoichiometry for $Cu_2ZnSnS_4$ (CZTS) synthesis.

BACKGROUND OF THE INVENTION

Due to many advantages, CZTS is a promising semiconductor compound material for solar cell thin film applications. First, the band gap $E_G$ of the material is 1.4 to 1.5 eV and is thus near the optimal value for photovoltaic application. This material also has a high optical absorption coefficient of above $10^4 \, cm^{-1}$. In addition, all the constituents of the material are non-toxic elements and are abundant on earth (H. Katagiri et al., "Development of Thin Film Solar Cell Based on $Cu_2ZnSnS_4$ Thin Films", Solar Energy Mat. & Solar Cells, 65 (2001), 141-148; H. Katagiri, "$Cu_2ZnSnS_4$ Thin Film Solar Cells", Thin Solid Films, 480-481 (2005), 426-432; K. Moriya et al., "Characterization of $Cu_2ZnSnS_4$ Thin Films Prepared by Photo-Chemical Deposition", Jap. J. Appl. Phys., 44 (1B) (2005), 715-717).

Solar cells are devices that have the characteristics to convert the energy of light into electric energy. Several systems have been developed to maximize the amount of light intercepted and converted to electricity, such as optical concentrators or multi-junctions cells, said cells consisting of junctions with different band gaps (highest band gap on top). Part of the non-absorbed light in the uppermost junction will be absorbed by the second junction lying there beneath, and further non-absorbed light will be absorbed by further junctions lying beneath said second junction and so forth.

A conventional thin film solar cell is composed of a stacking of thin layers on a flat substrate, said thin layers forming the junction. In order to intercept as much sunlight as possible, the visible surface of the junction is maximized, in particular by using a front contact being formed from a thin grid.

CZST thin films are p-type and can serve as an absorber layer in thin film solar cells (K. Moriya at al., ibid.). Various processes for the deposition of CZTS thin films are described in the literature. In 1988 K. Ito at al. formed quaternary stannite-type semiconductor films of CZTS with (112) orientation on heated glass substrate using atom beam sputtering. The sputtering target was made from a synthesized powder of the quarternary compound. Pure argon was used as a sputtering gas (K. Ito et al., "Electrical and Optical Properties of Stannite-Type Quarternary Semiconductor Thin Films", Jap. J. Appl. Phys., 27 (11) (1988), 2094-2097).

Later they continued their studies by using a spray hydrolysis technique for synthesis of the CZTS thin films (N. Nakayama et al., "Sprayed Films of Stannite $Cu_2ZnSnS_4$", Appl. Surf. Sci., 92 (1996), 171-175).

J. Madarász at al. applied a spray pyrolysis deposition technique in the same way (J. Madarász at al., "Thermal Decomposition of Thiourea Complexes of Cu(I), Zn(II) and Sn(II) Chlorides as Precursors for the Spray Pyrolysis Deposition of Sulfide Thin Films", Solid State Ionics, 141-142 (2001), 439-446).

The layers produced by decomposition of thiourea from the sprayed electrolyte parallel to a co-deposition of metal chlorides produced almost stoichiometric compositions. In both working groups an annealing step after the deposition was necessary.

All these studies were focused to collect basic physical data, such as band gap energy and absorption coefficient. These studies confirmed that kesterite ($Cu_2ZnSnS_4$) is a hopeful candidate to be used as a thin film solar cell material. This material is a p-type semiconductor which is has a tetragonal structure derived from the ZnS sphalerite (or zinkblende). The documents mentioned, however, do not disclose any solar cell conversion efficiencies and the research groups mentioned did not report such data until today.

In 1997 H. Katagiri at al. published an alternative CZTS synthesis. In the first step a metal sandwich layer (Cu/Zn/Sn) was deposited by PVD technique while in a following step vapor-phase sulfurization was performed. The stacked precursors on the substrate were formed by depositing ZnS first, next Sn was deposited and last Cu was deposited by sequential evaporation. (H. Katagiri at al., "Preparation and Evaluation of $Cu_2ZnSnS_4$ Thin Films by Sulfurization", Solar Energy Mat. & Solar Cells, 49 (1997) 407-414).

In 2003 J.-S. Seal at al. have reported applying a PVD process (rf magnetron sputtering) for CZTS precursor deposition (J.-S.Seol at al., "Electrical and Optical Properties of $Cu_2ZnSnS_4$ Thin Films Prepared by RF Magnetron Sputtering Process", Solar Energy Mat. & Solar Cells, 75 (2003), 155-162).

H. Katagiri reported in 1997 data of a CZTS based solar cell to show an efficiency of 0.66% (H. Katagiri et al., ibid. (1997)). The reported efficiency improved to 2.62% in 2001 (H. Katagiri at al., ibid. (2001)). This reported efficiency also exceeded the efficiency reported by Th. M. Friedlmeier at al. in 1997 which was referred to be 2.3% (Th. M. Friedlmeier et al., "Growth and Characterization of $Cu_2ZnSnS_4$ and $Cu_2ZnSnSe_4$ thin Films for Photovoltaic Applications", Inst. Phys. Conf. Ser. No, 152: Sec. B: Thin Film Growth and Characterization (1998), 345-348).

Recently pure metal sputtering targets were replaced by metal sulfide ones to avoid expansion effects during the sulfurization step. From the scientific literature H. Katagiri et al. are estimated to be the leading research group which was confirmed in 2005 (H. Katagiri, ibid. (2005)) by a notice by reference to H. Katagiri at al., "Solar Cell Without Environmental Pollution by Using CZTS Thin Films", Proceedings of the $3^{rd}$ World Conference on Photovoltaic Energy Conversion, Osaka, 2874 (2003), that the so far highest reported efficiency value of 5.45% would have been reached in 2003.

Coatings of an alloy comprising copper, zinc and tin, having different atomic ratios, and which are produced by electrodeposition, have an outstanding corrosion resistance. Hence, these systems have gained attention as a replacement for nickel. However, most of the commercially available plating solutions contain free cyanide to maintain high stability of the plating composition used and a constant metal composition:

In U.S. Pat. No. 2,435,967 an electroplating bath for depositing a bright silvery alloy plate is disclosed, which is composed of 50% to 75% copper, 15% to 30% tin and 5% to 20% zinc. The bath comprises, in combination, an aqueous electrolyte composed of free cyanide, copper, tin, zinc, alkali metal hydroxide, an alkali metal carbonate and an anti-pitting and brightening agent composed of a betaine having at least one non-cyclic hydrocarbon radical which contains from 10 to 20 carbon atoms.

U.S. Pat. No. 2,530,967 discloses a method of electrodepositing bright silvery corrosion-resisting coatings of a ternary alloy composed of from 50% to 75% copper, 15% to 30% tin and 5% to 20% zinc. An aqueous solution for electroplating this alloy is used, this solution comprising free cyanide, copper, tin, zinc, alkali metal hydroxide and alkali metal carbonate.

Further, general literature information on basic bath compositions and on monitoring is summarized in Metals Handbook, American Society for Metals, 9$^{th}$ ed. (1993), USA. Reference to bronze plating and ternary alloys of copper and tin that are alloyed with other metals can be plated, but control of the plating process is considered so difficult that they have found very limited use. In general, plating compositions are used which contain excess free cyanide.

In 1971 G. F. Jacky examined electroplating of copper-tin-zinc alloys. Estimated contents of the deposited layers ranged from 55% to 60% copper, 20% to 30% tin and 10% to 20% zinc. An alkaline cyanide aqueous plating bath was used. (G. F. Jacky, "Electroplating a Copper-Tin-Zinc Alloy", Plating 58 (1971), 883-887). The high-performance of this coating system was outlined without giving any detailed information about long term stability or layer composition adjustment.

In 1985, the commercial system Optalloy® (trade mark of Collini-Flühmann, CH) was claimed to be more stable than competing bath systems. J. Cl. Puippe used this commercial bath to study influence of pulsed currents on alloy plating. Besides enhanced reproducibility and improved surface appearance, even adjustment of coating composition could be achieved while using pulse plating (J. Cl. Puippe, "Optalloy—eine elektrolytisch hergestellte Cu—Zn—Sn-Legierung", Galvanotechnik, 76 (1985), 536-441).

In the same year further reports about the commercial Cu—Zn—Sn application Optalloy® confirmed the predicted properties of this electrolyte system (R. Jurczok et at, "Anwendungstechnische Eigenschaften von galvanischen Kupfer-Zinn-Zink-Schichten in der Elektroindustrie", Metalloberfläche, 39 (1985), 201-203).

L. Picincu et al published an investigation about the deposition kinetics of the ternary alloy process in 2001 by using the cyanide containing commercial plating bath Sucoplate® (trade mark of Huber+Suhner AG, CH) (L. Picincu et al., "Electrochemistry of the SUCOPLATE® Electroplating Bath for the Deposition of Cu—Zn—Sn alloy; Part II: Influence of the Concentration of Bath Components", J. Appl. Electrochem., 31 (2001), 395-402). Alloy compositions were obtained ranging from 47% to 51% copper, 8% to 12% zinc and 38% to 43% tin. The electrolyte compositions used to plate these alloys are reported to contain cyanide.

All so far published copper-zinc-tin bath systems would require a fundamental optimization to achieve the metal ratios necessary for a CZTS solar cell precursor (Cu: 50 at.-%, Zn: 25 at.-%, Sn: 25 at.-%). Due to the very high toxicity of cyanide it would be more favourable to develop a non-cyanide plating system. This demand is not served from any known electrolyte.

On a first glance, scientific literature seems to offer several binary electrolytes (Cu/Sn; Cu/Zn; Sn/Zn). However, looking closer most of them cannot fulfil the demand of $Cu_2ZnSn$ stoichiometry.

There are just some patents on electrodeposition processes for CuZnSn without using cyanide as a complexing agent. It is known that pyrophosphate based electrolytes offer a high stability and good plating properties. Nevertheless, the low metal contents in the electrolytes described as well as the resulting alloy composition do not fulfil the demand of $Cu_2ZnSn$ stoichiometry.

JP 63-206494 A relates to bright copper-tin-zinc alloy electroplating baths free of cyano compounds. These baths comprise salts of Cu, Zn and Sn, alkali metal salts of pyrophosphoric acid and/or polyphosphoric acid, one or more hydroxycarboxilic acid and/or the salts thereof and one or more amino acids and/or the salts thereof. As an example an iron plate was electroplated in a bath consisting of copper pyrophoshate, zinc pyrophospate, potassium stannate, potassium pyrophosphate, sodium polyphosphate, sodium citrate and glycine at 35° C., pH 10.8 and at 0.3-5 A/dm$^2$ cathodic current density to give a bright golden coating. However, the CuZnSn layer deposited does not exhibit the stoichiometry necessary for the use as thin film solar cells. The attempt to increase the tin and zinc content of the deposited layers causes precipitation of the electrolyte.

SU 1236010 A relates to an electrolyte for the deposition of coatings of copper-zinc-tin alloys, which comprises copper sulfate, zinc sulfate, tin sulfide and potassium pyrophosphate. The baths additionally contain polyvinylpyrrolidone. Deposition is performed at 20-40° C., 0.5-1.8 A/dm$^2$ and pH 7-8.5. Tin content in the alloy deposited is 1-3 at.-%. These highly copper-rich deposits (72-90 at.-%) are used to produce structures of low friction for machine engineering devices. Such alloys are further taught to have low internal stress.

Further, K. Moriya et at, "Characterization of $Cu_2ZnSnS_4$, Thin Films Prepared by Photo-Chemical Deposition", Jap. J. Appl. Phys., 44 (1B9 (2005), 515-717, disclose the preparation of CZTS thin films by photo-chemical deposition. This method starts from an aqueous solution containing copper sulfate, zinc sulfate, tin(IV) sulfate and sodium thiosulfate. The solution is flown on a soda-lime glass substrate which is illuminated with Deep-UV light of 254 nm. The films deposited are annealed in an atmosphere of $N_2$ at 200° C., 300° C. or 400° C. The films obtained are p-type semiconductors and show photoconductivity.

The segregation of secondary phases in the quaternary system copper-zinc-tin-sulfur due to non-stoichiometry has been studied by Th. M. Friedlmeier, "Multinary Compounds and Alloys for Thin-Film Solar Cells: $Cu_2ZnSnS_4$ and Cu(In, Ga)(S,Se)$_2$", Fortschr.-Ber. VDI, Reihe 9, Nr. 340, VDI-Verlag, Dusseldorf (2001). These secondary phases are the ternary compound $Cu_2SnS_3$ (copper tin sulfide, CTS) and the binary sulfides sphalerite ZnS, chalcocite CuS, $Cu_{1.8}S$, SnS and $SnS_2$.

No other quaternary compounds have been reported in the kesterite system.

$Cu_2SnS_3$ has a cubic structure with lattice parameters similar to kesterite 5.445 Å, lattice mismatch: 0.37%). CIS forms a solid solution with CZTS, up to a total amount of more than 50 wt.-% of CTS in CZTS.

ZnS obviously has a structure and lattice parameters similar to kesterite, but no solid solution is reported in this case, ZnS segregates from CZTS, but the morphology of this segregation has not been studied: So, both grain boundaries precipitation and precipitation inside the grains of kesterite are possible.

$Cu_{1.8}S$ has a cubic structure with a lattice mismatch of 2.6% to kesterite, but the miscibility of both compounds has not been studied. Th. M. Friedlmeier presumes that copper sulfides $Cu_{1.8}S$ and CuS could precipitate at the grain boundaries or even inside the grains.

Tin sulfides SnS and $SnS_2$ have an orthorhombic and hexagonal structure, respectively, with lattice constants too different from kesterite's for a solid solution to form. These phases are thus expected to segregate from kesterite.

The non-stoichiometry of elements in the kesterite would thus be accommodated as follows: excess of both elements copper and tin would result in a solid solution of $Cu_2SnS_3$; excess of copper only would result in segregation of copper sulfides CuS and $Cu_{1.8}S$ (with predominance of CuS when sulfurization is processed under S excess); excess of zinc would result in segregation of ZnS phase; and excess of tin only would result in precipitation of tin sulfide phases SnS and $SnS_2$.

Owing to the complexity of the phase system on the one hand and to the difficulty to accurately analyse these phases within a thin film, the effect of the presence of secondary phases in the kesterite thin film on optical and electrical properties has not be investigated yet.

Nevertheless, copper sulfide is known to be highly conductive and may cause shunt paths through the absorber layer. The ternary compound CTS is also suspected to have the same effect, the solid solution CZTS-CTS being much more conductive than pure CZTS.

OBJECTS OF THE INVENTION

An object of the present invention is to provide a thin film solar cell being composed of ubiquitous material and being manufacturable easily.

More specifically, a further object of the invention is to provide a thin film of CZTS ($Cu_2ZnSnS_4$) and related compounds like $Cu_xZn_ySn_zCh1_aCh2_b$.

A still further object of the present invention is to provide precursors of these chalcogenides, i.e., more specifically, $Cu_xZn_ySn_z$.

Thus, more specifically, an object of the present invention is also to provide a method of depositing $Cu_xZn_ySn_z$, $Cu_xZn_ySn_zS_a$ (CZTS), $Cu_xZn_ySn_zSe_b$ (CZTSe) or $Cu_xZn_ySn_zS_aSe_b$ (CZTSSe) layers with well-defined total bulk stoichiometries, wherein x ranges from 1.5 to 2.5, y ranges from 0.9 to 1.5, z ranges from 0.5 to 1.1, a ranges from 0 to 4.2, preferably from 0.1 to 4.2, and b ranges from 0 to 4.2, preferably from 0.1 to 4.2, and which method is easy to apply and suitable for large scale production of thin film solar cells.

A still further object of the present invention is to deposit the precursors as given herein above and the chalcogenides as given herein above without using toxic plating compositions, like cyanide compounds.

A still further object of the present invention is to provide a plating composition to deposit the precursors as given herein above or the chalcogenides as given herein above which is stable to deposit such precursor or chalcogenide at a well-defined stoichiometry.

SUMMARY OF THE INVENTION

As used herein after and in the claims, the term "copper-zinc-tin alloy" denotes an alloy comprising the indicated elements and optionally additionally at least one chalcogen. Such alloy comprising at least one chalcogen may, if chalcogen is sulfur which is comprised in the alloy ($Cu_2ZnSnS_4$), be present in the stannite type structure (kesterite).

As used herein after and in the claims, the term "alkyl" denotes both unbranched and branched alkyl moieties and more specifically $C_1$-$C_8$ alkyl, even more specifically $C_1$-$C_4$ alkyl, most preferably methyl, ethyl, n-propyl, i-propyl, n-butyl, i-butyl and t-butyl.

As used herein after and in the claims, the term "hydroxyalkyl" denotes both unbranched and branched hydroxyalkyl moieties, the hydroxy group being bonded to any of the carbon atoms of the alkyl moiety, more specifically $C_1$-$C_8$ hydroxyalkyl, even more preferably $C_1$-$C_4$ hydroxyalkyl, most preferably hydroxymethyl (HO—$CH_2$—), 1-hydroxyethyl ($CH_3$—CH(OH)—), 2-hydroxyethyl (HO—$CH_2$—$CH_2$—), 1-hydroxy-propyl ($CH_3$—$CH_2$—CH(OH)—), 2-hydroxypropyl ($CH_3$—CH(OH)—$CH_2$—), 3-hydroxypropyl (HO—$CH_2$—$CH_2$—$CH_2$—), 1-hydroxy-1-methyl-ethyl ($CH_3$—C($CH_3$)(OH)—), 2-hydroxyl-1-methyl-ethyl (HO—$CH_2$—CH($CH_3$)—) and the respective isomers of the hydroxybutyl moiety.

As used herein after and in the claims, the term "forming a common condensation chain" denotes the bond making between two functional groups which upon bond making release one or more water or ammonia molecules, e.g., bond making between a COOH functional group and a $SO_2NHR^4$ functional group leading to a COO—$NR^4SO_2$ moiety.

As used herein after and in the claims, the terms "copper plating species", "zinc plating species" and "tin plating species" denote metal plating species which are characterized by compounds being the metal ions and capable of releasing metal ions, such as salts thereof or complexes thereof.

As used herein and in the claims, the term "stannate" denotes the chemical ions $SnO_3^{2-}$ and $Sn(OH)_6^{2-}$.

As used herein after and in the claims, the term "chalcogen" denotes sulfur, selenium and tellurium.

As used herein after and in the claims, the term "chalcogen plating species" denote compounds which are able to plate a chalcogen into the alloy. Such species may be compounds having the chalcogen being bonded at an oxidation number of below +VI in the case of sulfur and preferably down to 0, i.e., including elemental chalcogen.

As used herein after and in the claims, the term "oxalate, citrate and gluconate compounds" specifically denote the respective acid moieties like oxalic acid and citric acid and the salts thereof.

As used herein after and in the claims, the term "thiosulfate" denotes the compound $M_2S_2O_3$, with M being an alkali or earth alkali metal or the like, more specifically a metal like sodium, potassium or the like.

As used herein after and in the claims, the term "thiosulfonic acid" denotes compounds having the structural element —SO(S)—O—, wherein SO forms an S=O double bond and S(S) forms an S=S double bond. The general chemical formula may be as follows:

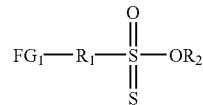

wherein $FG_1$ may be any functional group and $R_1$, $R_2$ may be any organic structure, more specifically either aliphatic, aromatic or the like. $R_2$ may also be hydrogen. More specifically, in this structural element a substituted or unsubstituted aliphatic group, like an alkyl group for example a $C_1$-$C_4$ alkyl group, or a substituted or unsubstituted aromatic group may be bonded to the central sulfur atom. This alkyl group may be substituted with OH, $NR^3R^4$ or the like. A substituted or unsubstituted aliphatic group, like an alkyl group, for example a $C_1$-$C_4$ alkyl group, or a substituted or unsubstituted aromatic group may be bonded to the singly bonded O atom. This aliphatic group, for example alkyl group, or aromatic group may be substituted with OH, $NR^3R^4$ or the like.

As used herein after and in the claims, the term "di(thiosulfonic) acid" denotes compounds having the structural element —O—SO(S)—X—SO(S)—O—, wherein X may be any bridging radical like an aliphatic or aromatic radical and the other elements are the same as for thiosulfonic acid. The general chemical formula may be as follows:

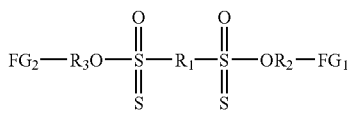

wherein $FG_1$, $R_1$, $R_2$ have the same meanings as for thiosulfonic acids. $FG_2$ may be the same as $FG_1$ but may be independently selected. R3 can likewise be any organic structure, more specifically either aliphatic, aromatic or the like. In the —O—SO(S)—X—SO(S)—O— group moieties may more preferably be bonded to the singly bonded 0 atoms as in the thiosulfonic acids.

As used herein after and in the claims, the term "sulfur sulfide" denotes a species of $M_2S$ with M being alkali or the like, more specifically a metal like sodium, potassium or the like, formed in aqueous solution, wherein elemental sulfur is dissolved in water. Sulfur sulfides are used to form charge transfer complexes or any other chemical complex dissolving elemental sulfur.

As used herein after and in the claims, the term "derivatives of thiourea" denotes compounds having the general chemical formula

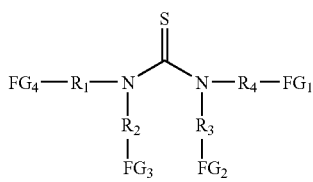

wherein $FG_1$, $FG_2$, $FG_3$, $FG_4$ may be any functional group and $R_1$, $R_2$, $R_3$, $R_4$ may be either any organic structure, more specifically be either aliphatic, aromatic or the like. $FG_1$, $FG_2$, $FG_3$, $FG_4$, $R_1$, $R_2$, $R_3$, $R_4$ may be the same or different from each other. More specifically this term denotes compounds having the general chemical formula $R^6R^7N$—CS—$NR^8R^9$, with $R^6$, $R^7$, $R^8$, $R^9$ being any substituted or unsubstituted aliphatic group, like an alkyl group, for example a $C_1$-$C_4$ alkyl group, or any substituted or unsubstituted aromatic group.

As used herein after and in the claims, the terms "disulfide" and "polysulfide" denote compounds having the general chemical formula

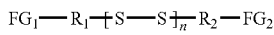

wherein n ranges from 1 to 5. $R_1$, $R_2$ means any organic structure, being either aliphatic, aromatic or the like. Furthermore $R_1$, $R_2$ may be the same or different. $FG_1$, $FG_2$ may be any functional group and may be the same or different. More specifically these terms denote compounds which have the structural element —S—$(S)_c$—S—, wherein c may be zero (disulfide) or an integer greater than zero (polysulfide). This structural element may be bonded to any substituted or unsubstituted aliphatic group, like to an alkyl group, for example to a $C_1$-$C_4$ alkyl group, or to any substituted or unsubstituted aromatic group.

As used herein after and in the claims, the term "selenate" denotes the compound $M_2SeO_4$, with M being an alkali or earth alkali metal or the like, more specifically a metal like sodium, potassium or the like.

As used herein after and in the claims, the term "selenosulfite" denotes the compound $M_2SeSO_3$, with M being an alkali or earth alkali metal or the like, more specifically a metal like sodium, potassium or the like.

As used herein after and in the claims, the terms "diselenide" and "polyselenide" denote compounds having the general chemical formula

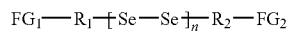

wherein n ranges from 1 to 5. $R_1$, $R_2$ mean any organic structure, being either aliphatic, aromatic or the like. Furthermore $R_1$, $R_2$ may be the same or different. $FG_1$, $FG_2$ may be any functional group and may be the same or different. More specifically these terms denote compounds having the structural element —Se—$(Se)_d$—Se—, wherein d may be zero (diselenide) or an integer greater than zero (polyselenide). This structural element may be bonded to any substituted or unsubstituted aliphatic group, like to an alkyl group, for example to a $C_1$-$C_4$ alkyl group, or to any substituted or unsubstituted aromatic group.

According to a first aspect of the present invention, a metal plating composition for the deposition of a copper-zinc-tin alloy is provided, said alloy optionally additionally containing at least one chalcogen. Said metal plating composition comprises at least one copper plating species, at least one zinc plating species, at least one tin plating species and at least one complexing agent and further, if the alloy contains at least one chalcogen, at least one chalcogen plating species. The metal plating composition additionally comprises at least one additive, selected from the group comprising disubstituted benzene compounds having general chemical formula I:

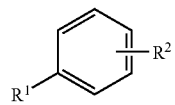

wherein $R^1$ and $R^2$ are the same or different, are selected independently from the group comprising OH, SH, $NR^3R^4$, CO—$R^5$, $COOR^5$, $CONR^3R^4$, $COSR^5$, $SO_2OR^5$, $SO_2R^5$, $SO_2NR^3R^4$ and the salts thereof or have the aforementioned meanings and form a common condensation chain;

with $R^3$ and $R^4$ being the same or different, being selected independently from the group comprising H and alkyl; and with $R^5$ being selected from the group comprising H, alkyl and hydroxyalkyl.

$R^1$ and $R^2$ may be bonded to the benzene ring in ortho-orientation or meta-orientation or para-orientation relative to each other.

Thus, according to this first aspect of the present invention, a precursor layer may be deposited using the plating composition of the present invention. Or an absorber layer containing at least one chalcogen in addition to copper, zinc and tin may be deposited in one process step as an alloy layer.

Further, according to a second aspect of the present invention, a method of depositing such copper-zinc-tin alloy is provided in order to plate such alloy layer, said method comprising contacting a substrate and an anode with the metal plating composition of the invention and flowing an electric current between said substrate and the anode. Such method will be suitable to electroplate an alloy containing copper, zinc and tin, but no chalcogen, or the aforementioned metals together with at least one chalcogen.

According to a third aspect of the present invention, a sandwich layer may be formed, said sandwich layer comprising copper, zinc and tin and optionally at least one chalcogen in addition to the aformentioned metals. Such sandwich layer will consist of a plurality of individual monolayers which are deposited sequentially onto a substrate and which each contain at least one of the metals selected from the group comprising copper, zinc and tin. In general each monolayer will consist of only one metal, i.e., either of copper or of zinc or of tin, and may also contain chalcogen monolayers, e.g., selenium monolayers. Or the chalcogen may be comprised in any one of the monolayers which contain one or more metals selected from the group comprising copper, zinc and tin. In order to convert such sandwich layer into an alloy layer, the sandwich layer is heated and/or subjected to chalcogen.

Further, according to a fourth aspect of the present invention, a method of preparing such sandwich layer containing copper, zinc, tin and optionally additionally at least one chalcogen is provided. This method preferably comprises sequentially depositing copper monolayers, zinc monolayers and tin monolayers, and optionally additionally at least one chalcogen to at least one of said monolayers. This method comprises depositing said monolayers by using wet-chemical metal plating compositions to form said sandwich layer.

In a preferred embodiment of this invention the method according to the fourth aspect of the present invention comprises using at least one of said metal plating compositions to deposit a sandwich layer, this plating composition additionally comprising at least one additive, selected from the group comprising disubstituted benzene compounds having general chemical formula I

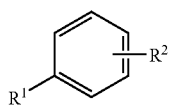

wherein $R^1$ and $R^2$ are the same or different, are selected independently and are selected from the group comprising OH, SH, $NR^3R^4$, CO—$R^5$, COOR$^5$, CONR$^3R^4$, COSR$^5$, SO$_2$OR$^5$, SO$_2R^5$, SO$_2NR^3R^4$ and the salts thereof or have the aforementioned meanings and form a common condensation chain;
with $R^3$ and $R^4$ being the same or different, being selected independently and being selected from the group comprising H and alkyl; and
with $R^5$ being selected from the group comprising H, alkyl and hydroxyalkyl.

According to a fifth aspect of the present invention a thin film solar cell is provided, which comprises inter alia a p-type absorber layer which is comprised of a copper-zinc-tin alloy which comprises at least one chalcogen and which has chemical formula $Cu_xZn_ySn_zS_a$ with x being from 1.5 to 2.5, y being from 0.9 to 1.5, z being from 0.5 to 1.1 and a being from 3.8 to 4.2, or having chemical formula $Cu_xZn_ySn_zS_aSe_b$ with x being from 1.5 to 2.5, y being from 0.9 to 1.5, z being from 0.5 to 1.1, a being from 0.1 to 4.2 and b being from 0.1 to 4.2. This alloy layer may be made with any of the methods described herein above.

More specifically according to another aspect of the present invention a method of producing the thin film solar cell of the fifth aspect of the present invention is provided, which method comprises providing a substrate film, optionally depositing on the substrate film a barrier layer, which serves as an electrical isolator or as a diffusion barrier to prevent any constituent of the substrate to diffuse there through, providing an electrically conductive back contact layer, providing a p-type absorber layer, which p-type absorber layer is comprised of a copper-zinc-tin alloy which further comprises at least one chalcogen and which has chemical formula $Cu_xZn_ySn_zS_a$ with x being from 1.5 to 2.5, y being from 0.9 to 1.5, z being from 0.5 to 1.1 and a being from 3.8 to 4.2, or having chemical formula $Cu_xZn_ySn_zS_aSe_b$ with x being from 1.5 to 2.5, y being from 0.9 to 1.5, z being from 0.5 to 1.1, a being from 0.1 to 4.2 and b being from 0.1 to 4.2, further providing at least one n-type buffer layer and further providing at least one window layer. The alloy layer may be made with any of the methods described herein above.

According to a sixth aspect of the present invention, a copper-zinc-tin alloy having the chemical formula $Cu_xZn_yS_nzS_aSe_b$ is provided, wherein x is preferably from 1.5 to 2.5, y is preferably from 0.9 to 1.5, z is preferably from 0.5 to 1.1, a is preferably from 0.1 to 4.2 and b is preferably from 0.1 to 4.2.

DETAILED DESCRIPTION OF THE INVENTION

Figure 1:
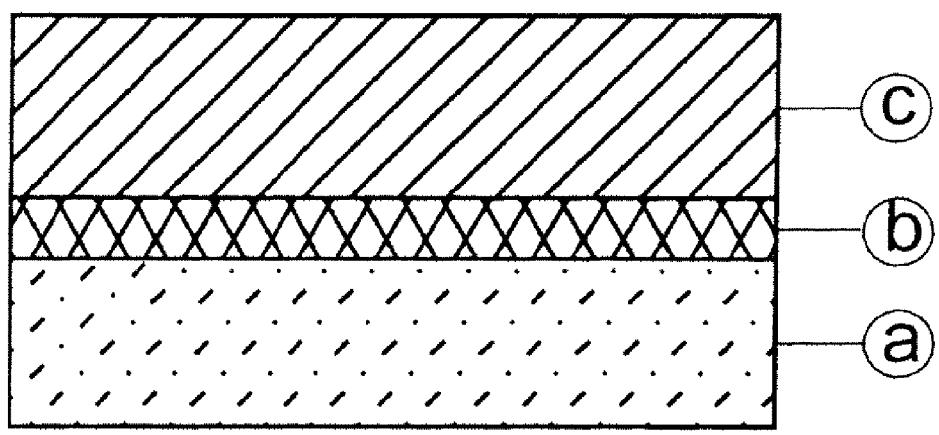
FIG. 1 shows a schematic layer structure of a glass substrate (a) being coated with a back contact (molybdenum layer) (b) and an electrodeposited $Cu_xZn_ySn_z$ layer, optionally containing S and/or Se ($Cu_xZn_ySn_zS_aSe_b$) (c)

Using the additive in the plating composition of the invention makes the adjustment of alloy composition very easy in that said additives importantly influence alloy composition. The additives may be preferably used in the alloy plating composition, but may also advantageously be used in those plating compositions which are used for preparing the monolayers which together form the sandwich layer.

Coating thin layers of metal by way of electrochemistry is nowadays a well-known and frequently used technique, in particular for depositing copper, zinc and tin. Electroless deposition as well as electrodeposition of such metals have been developed for the purposes of decorative industry, protection against corrosion and for the electronic industry, and have reached a mature stage.

The galvanic bath for depositing a copper-zinc-tin alloy, more specifically a Cu$_x$Zn$_y$Sn$_z$ alloy (1.5<x<2.5; 0.9<y<1.5; 0.5<z<1.1), is used for depositing this alloy into a suitable electrically conductive substrate. Such substrate may be a metal foil or sheet or a dielectric having an electrically conductive layer deposited thereon, like a glass substrate being provided with a metal layer. The bath preferably comprises water-soluble salts of copper, zinc and tin, further a buffer system and a complexing agent.

The additives are preferably selected from the group comprising:

para-substituted benzenes:

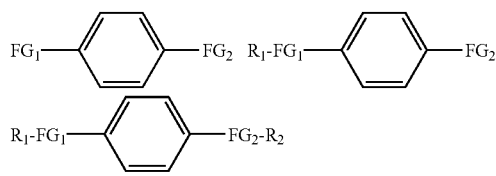

meta-substituted benzenes:

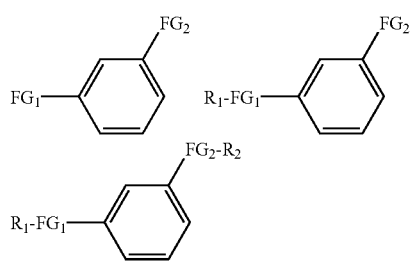

ortho-substituted benzenes:

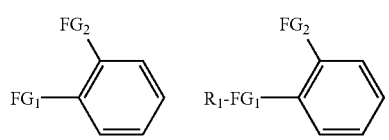

-continued

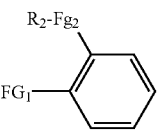

The functional groups FG$_1$ and FG$_2$ in the chemical formulae herein above are mono- or difunctional groups. If they are monofunctional groups, they are —H, —SO$_3^-$, —SO$_2^-$, —O$^-$, —S$^-$, —NR$_3^-$ or the corresponding salts thereof or may further be —COO$^-$, —COOH, —CHO. If they are difunctional groups, they are —COO—, —COS—. The substituted radicals R$_1$, R$_2$ may be hydrogen or any organic structure, more specifically either aliphatic, aromatic or the like. Furthermore R$_1$, R$_2$ may be different or equal.

Preferably, in the additive in the metal plating composition according to the first aspect of the present invention, the substitutents on the benzene rings are selected from the group comprising COOH/COO$^-$, COOCH$_2$CH$_2$OH, COOCH$_2$CH$_3$, COOCH$_3$, SO$_3$H/SO$_3^-$, OH, NH$_2$, CHO and may further be alkyl or hydroxyalkyl, or FG$^1$ and FG$^2$ together form a moiety CO—NH—SO$_2$, said moiety being bonded to positions in ortho-orientation to the benzene ring.

The plating composition containing the above additives is a novel cyanide-free galvanic bath, which has been developed in order to deposit layers of the desired and well-defined stoichiometry. The additive serves to yield the desired stoichiometry of the deposited Cu$_2$ZnSn or Cu$_2$ZnSnS$_a$Se$_b$ layer.

This additive may more preferably be selected from the group comprising

Benzoic acid and sulfonic acid

Ortho-, meta-, para-substituted (R) benzoic acids and the esters thereof

Phthalic acid/phthalic sulfonic acid and the esters thereof

Isophthalic acid/phthalic sulfonic acid and the esters thereof

Terephthalic acid/phthalic sulfonic acid and the esters thereof

Saccharin.

More preferably the following compounds have proved to be very effective:

i1) Potassium hydrogen terephthalic acid (877-24-7):

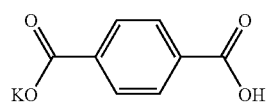

i2) Terephthalic acid -bis(2-hydroxyethylester) (959-26-2):

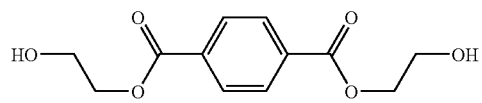

i3) Benzene-1,3-disulfonic acid, disodium salt (831-59-4):

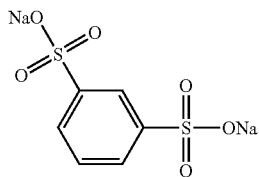

i4) 4-Hydroxybenzoic acid ethylester (120-47-8):

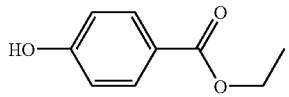

i5) 4-Hydroxybenzoic sulfonate, sodium salt (825-90-1):

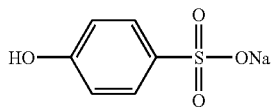

i6) 4-Hydroxybenzoic acid (99-96-7):

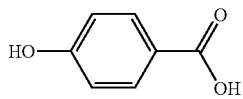

i7) Terephthalic acid methylester (1679-64-7):

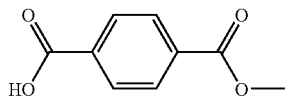

i8) Sulfanilic acid (121-57-3):

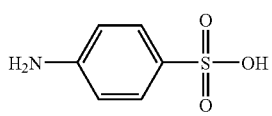

i9) Terephthalic acid (623-27-8):

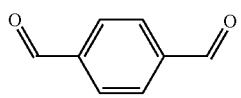

i10) Saccharin (81-07-2):

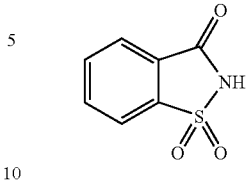

More preferably, the copper-zinc-tin alloy is a $Cu_xZn_ySn_zCh1_aCh2_b$ alloy, with Ch1 being a first chalcogen, Ch2 being a second chalcogen and wherein x is from 1.5 to 2.5, y is from 0.9 to 1.5, z is from 0.5 to 1.1, a is from 0 to 4.2 and b is from 0 to 4.2.

Even more preferably, the copper, zinc and tin plating species are comprised in the composition at a molar ratio of copper:zinc:tin=1:0.1-10:0.1-4, more specifically 2-8:0.4-1.

Even more preferably, the copper plating species are copper phosphates or copper pyrophosphates and the zinc plating species are zinc phosphates or zinc pyrophosphates. In a further preferred embodiment of the present invention, the tin plating species are tin stannates.

Even more preferably, at least one complexing agent is selected from the group comprising oxalate, citrate and gluconate compounds.

Even more preferably, the composition further comprises a buffer system. Said buffer system may be comprised of hydrogenphosphate/phosphate.

Even more preferably, the composition has a pH value of from about 8 to about 13, most preferably of from about 10 to about 12. Accordingly, the composition may have a pH value in the range of greater than 10.5 to about 12.

Even more preferably, the composition further comprises at least one wetting agent.

In a further preferred embodiment of the present invention, the copper-zinc-tin alloy comprises Ch1, wherein Ch1 may be sulfur. Thus, when a>0, Ch1 is S and at least one chalcogen plating species is a sulfur plating species (sulfur source: $Cu_xZn_ySn_zS_a$ or $Cu_xZn_ySn_zS_aSe_b$: $1.5<x<2.5$; $0.9<y<1.5$; $0.5<z<1.1$; $0.1<a<4.2$; $0<b<4.2$). Said sulfur plating species is selected from the group comprising thiosulfates, thiosulfonic acids, di(thiosulfonic) acids, sulfur sulfides, thiourea and the derivatives thereof, organic disulfides, organic polysulfides, colloidal elemental sulfur and compounds forming colloidal elemental sulfur, including sulfur which has been formed in a reaction where colloidal sulfur is present as an intermediate. Preferred sulfur plating species are benzene sulfonic acid and benzene di(thionosulfonic) acid. By using this sulfur source, sulfur is incorporated into the deposited alloy layer to form $Cu_xZn_ySn_zS_a$, with x being from 1.5 to 2.5, y being from 0.9 to 1.5, z being from 0.5 to 1.1 and a being from 0.1 to 4.2.

In a further preferred embodiment of the present invention, when b>0, Ch2 is Se and at least one chalcogen plating species is a selenium plating species (selenium source: $Cu_xZn_ySn_zSe_b$ or $Cu_xZn_ySn_zS_aSe_b$: $1.5<x<2.5$; $0.9<y<1.5$; $0.5<z<1.1$; $0<a<4.2$; $0.1<b<4.2$). Said selenium plating species is selected from the group comprising selenates, selenosulfites, diselenides and polyselenides. By using this selenium source, selenium is incorporated into the deposited alloy layer to form $Cu_xZn_ySn_zSe_b$, with x being from 1.5 to 2.5, y being from 0.9 to 1.5, z being from 0.5 to 1.1 and b being from 0.1 to 4.2.

In a further preferred embodiment of the present invention, the copper-zinc-tin alloy comprises both Ch1 and Ch2, wherein Ch1 may be sulfur and Ch2 may be selenium. In such case the copper-zinc-tin alloy may be $Cu_xZn_ySn_zS_aSe_b$ with x, y, z being as before and a and b being each from 0 to 4.2.

More specifically, the bath additionally may contain a mixture of the sulfur and selenium sources to deposit layers which contain sulfur as well as selenium in order to form layers of $Cu_xZn_ySn_zS_aSe_b$ (1.5<x<2.5; 0.9<y<1.5; 0.5<z<1.1; 0.1<a<4.2; 0.1<b<4.2).

By using the sulfur and the selenium sources, sulfur and selenium is are incorporated into the deposited alloy layer to form $Cu_xZn_ySn_zS_aSe_b$, with x being from 1.5 to 2.5, y being from 0.9 to 1.5, z being from 0.5 to 1.1, a being from 0.1 to 4.2 and b being from 0.1 to 4.2.

Further, the method according to the second aspect of the invention comprises depositing a copper-zinc-tin alloy, said alloy optionally additionally containing at least one chalcogen, more specifically a $Cu_xZn_ySn_z$ alloy (1.5<x<2.5; 0.9<y<1.5; 0.5<z<1.1), a $Cu_xZn_ySn_zS_a$ alloy (1.5<x<2.5; 0.9<y<1.5; 0.5<z<1.1; 0.1<a<4.2), a $Cu_xZn_ySn_zSe_b$ alloy (1.5<x<2.5; 0.9<y<1.5; 0.5<z<1.1; 0.1<b<4.2) or a $Cu_xZn_ySn_zS_aSe_b$ alloy (1.5<x<2.5; 0.9<y<1.5; 0.5<z<1.1; 0.1<a<4.2; 0.1<b<4.2), onto a substrate.

To deposit the copper-zinc-tin alloy, the substrate is preferably contacted with an electrolytic bath at a temperature of from about 15° C. to about 80° C. to form such alloy.

Further preferably, the method according to the second aspect of the present invention further comprises sulfurizing the copper-zinc-tin alloy by contacting same with a sulfur plating species. More preferably, said sulfur plating species is selected from the group comprising elemental sulfur and a reducing atmosphere containing a sulfur compound.

Even more preferably, the method according to the second aspect of the present invention further comprises depositing a selenium monolayer onto the alloy.

More preferably, the method comprises selenizing the copper-zinc-tin alloy by contacting same with a reducing atmosphere containing a selenium compound.

Deposition of the copper, zinc and tin monolayers in the method according to the fourth aspect of the present invention which results in forming a sandwich layer is performed preferably electrolytically. In this embodiment of the present invention the $Cu_xZn_ySn_z$ sandwich layer or the $Cu_xZn_ySn_zSe_b$ sandwich layer is obtained by stepwise wet-chemical deposition of thin monolayers of copper, tin, zinc and, optionally, selenium on a suitable substrate with a metallic back contact.

More preferably, one of said metal plating compositions is a copper plating composition which is used for the deposition of copper and which comprises a water-soluble copper salt, a supporting electrolyte, a buffer system and a complexing agent. Still more preferably, the monolayer may be formed using an electroless plating process. In this case, the copper plating composition may contain NaOH as an alkaline supporting electrolyte, further the complexing agent may be tartrate and further components of the plating composition may be a stabilizer and a copper reduction agent. Such plating composition may for example be the Printoganth® MV Plus bath of Atotech (trade mark of Atotech Deutschland).

Further preferably, one of said metal plating compositions is a zinc plating composition which is used for the deposition of zinc and which comprises a water-soluble zinc salt and a supporting electrolyte. Still more preferably, the zinc plating composition may for example be the Zytite® HT bath of Atotech (trade mark of Atotech Deutschland).

Further preferably, one of said metal plating compositions is a tin plating composition which is used for the deposition of tin and which comprises a water-soluble tin salt, a supporting electrolyte and an antioxidant for tin(II) species. Still more preferably, the tin plating composition may for example be the Stannopure® HSM of Atotech (trade mark of Atotech Deutschland).

Even more preferably, each of the plating compositions mentioned herein before may contain at least one additive selected from the group comprising disubstituted benzene compounds having general chemical formula I as defined herein above. Even more preferably only the plating compositions for the deposition of copper and tin contain such additives. Still more preferably, in the additive used in at least one metal plating composition in the method according to the fourth aspect of the present invention, R' and $R^2$ are selected from the group comprising COOH, $COOCH_2CH_2OH$, $COOCH_2CH_3$, $COOCH_3$, $NH_2$, CHO or $R^1$ and $R^2$ together form a moiety $CO-NH-SO_2$, said moiety being bonded to positions in ortho-orientation to the benzene ring.

Even more preferably, the monolayers formed with the method according to the fourth aspect of the present invention may be stacked in any order and in any number of stackings.

Even more preferably the monolayers may be formed using either an electroless or an electrochemical process. An immersion plating process based on charge exchange reaction may also be used.

Even more preferably, depositing at least one chalcogen to at least one of said monolayers comprises sulfurizing either at feast one of said monolayers with a sulfur plating species or suffurizing said copper-zinc-tin sandwich layer by contacting same with a sulfur plating species.

More specifically, for preparing a layer of $Cu_xZn_ySn_zS_a$ (1.5<x<2.5; 0.9<y<1.5; 0.5<z<1.1; 3.8<a<4.2) the following method steps may be performed:

Preparing layers of $Cu_xZn_ySn_z$ or of $Cu_xZn_ySn_zS_a$ by using a method in which a layer of $Cu_xZn_ySn_z$ or of $Cu_xZn_ySn_zS_a$ (1.5<x<2.5; 0.9<y<1.5; 0.5<z<1.1; 0.1<a<4.2) is prepared by contacting a substrate with a suitable electrolytic bath at a temperature of from 15° C. to 80° C. and at a pH of from 8 to 13, or preparing sandwich layers consisting of copper, tin and zinc monolayers and having an overall composition of $Cu_xZn_ySn_z$ (1.5<x<2.5; 0.9<y<1.5; 0.5<z<1.1) by sequentially depositing stacked copper, tin and zinc onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter Sulfurizing the layers by contacting them with a sulfur-containing compound.

More specifically, for preparing a layer of $Cu_xZn_ySn_zS_aSe_b$ (1.5<x<2.5; 0.9<y<1.5; 0.5<z<1.1; 0.1<a<4.2; 0.1<b<4.2) the following method steps may be performed:

Preparing layers of $Cu_xZn_ySn_zSe_b$ or $Cu_xZn_ySn_zS_aSe_b$ (1.5<x<2.5; 0.9<y<1.5; 0.5<z<1.1; 0.1<a<4.2; 0.1<b<4.2) by contacting a substrate with a suitable electrolytic bath at a temperature of from 15° C. to 80° C. and at a pH of from 8 to 13, more preferably from 10 to 12; and thereafter Sulfurizing the layers by contacting them with a sulfur containing compound.

Even more preferably, the sulfur plating species is selected from the group comprising elemental sulfur and a reducing atmosphere containing a sulfur compound.

More specifically, sulfurization may be performed by contacting the layers herein above with a reducing sulfur atmosphere like $H_2S$ at temperatures higher than room temperature.

More specifically, sulfurization may be performed by contacting the layers herein above with elemental sulfur either at room temperature or at elevated temperatures higher than room temperature.

Even more preferably, depositing at least one chalcogen to at least one of said monolayers comprises depositing a selenium monolayer onto the sandwich layer.

More specifically, for preparing a layer of $Cu_xZn_ySn_zS_aSe_b$ ($1.5<x<2.5$; $0.9<y<1.5$; $0.5<z<1.1$; $0.1<a<4.2$; $0.1<b<4.2$) the following method steps may be performed:

Preparing layers of $Cu_xZn_ySn_z$, $Cu_xZn_ySn_zS_a$, $Cu_xZn_ySn_zSe_b$ or $Cu_xZn_ySn_zS_aSe_b$ ($1.5<x<2.5$; $0.9<y<1.5$; $0.5<z<1.1$; $0.1<a<4.2$; $0.1<b<4.2$) by contacting a substrate with a suitable electrolytic bath at a temperature of from 15° C. to 80° C. and at a pH of from 8 to 13, more preferably from 10 to 12, or preparing sandwich layers consisting of copper, tin and zinc and having an overall composition of $Cu_xZn_ySn_z$ ($1.5<x<2.5$; $0.9<y<1.5$; $0.5<z<1.1$) by sequentially depositing stacked metal layers onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter Depositing a selenium layer and sulfurizing the layers by contacting them with a sulfur-containing compound.

More specifically in this latter method depositing the selenium layer comprises depositing said layer using a (wet-chemical reaction) electrochemical reaction by either electroless or electrochemical deposition.

Even more preferably, depositing at least one chalcogen to at least one of said monolayers comprises selenizing the sandwich layer by contacting same with a reducing atmosphere containing a selenium compound.

More specifically, for preparing a layer of $Cu_xZn_ySn_zSe_b$ ($1.5<x<2.5$; $0.9<y<1.5$; $0.5<z<1.1$; $0.1<b<4.2$) the following method steps may be performed:

Preparing layers of $Cu_xZn_ySn_z$ or $Cu_xZn_ySn_zSe_b$ ($1.5<x<2.5$; $0.9<y<1.5$; $0.5<z<1.1$; $0.1<b<4.2$) by contacting a substrate with a suitable electrolytic bath at a temperature of from 15° C. to 80° C. and at a pH of from 8 to 13, more preferably from 10 to 12, or preparing sandwich layers consisting of copper, tin and zinc and having an overall composition of $Cu_xZn_ySn_z$ ($1.5<x<2.5$; $0.9<y<1.5$; $0.5<z<1.1$) by sequentially depositing stacked metal layers onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter Selenizing the layers by contacting them with a reducing selenium containing atmosphere like $H_2Se$ at elevated temperatures.

More specifically, for preparing a layer of $Cu_xZn_ySn_zS_aSe_b$ ($1.5<x<2.5$; $0.9<y<1.5$; $0.5<z<1.1$; $0.1<a<4.2$; $0.1<b<4.2$) the following method steps may be performed:

Preparing layers of $Cu_xZn_ySn_zS_a$, $Cu_xZn_ySn_zSe_b$ or $Cu_xZn_ySn_zS_aSe_b$ ($1.5<x<2.5$; $0.9<y<1.5$; $0.5<z<1.1$; $0.1<a<4.2$; $0.1<b<4.2$) by contacting a substrate with a suitable electrolytic bath at a temperature of from 15° C. to 80° C. and at a pH of from 8 to 13, more preferably from 10 to 12, or preparing sandwich layers consisting of copper, tin and zinc and having an overall composition of $Cu_xZn_ySn_z$ ($1.5<x<2.5$; $0.9<y<1.5$; $0.5<z<1.1$) by sequentially depositing stacked metal layers onto a substrate having a layer thickness suitable to achieve the desired stoichiometry by contacting the substrate with an electrolytic bath for the deposition of copper, with an electrolytic bath for the deposition of tin and with an electrolytic bath for the deposition of zinc in any order and any number of stackings; and thereafter Selenizing the layers by contacting them with a reducing selenium containing atmosphere like $H_2Se$ at elevated temperatures.

The suitable electrolytic baths mentioned herein above are those plating compositions which are described in this application to be suitable to deposit copper-zinc-tin alloys including at least one chalcogen. The electrolytic baths for the deposition of copper, zinc or tin mentioned herein above are those plating compositions which are described in this application to be suitable to deposit the copper, zinc or tin monolayers.

According to the fifth aspect of the present invention a thin film solar cell is provided which comprises a substrate film, optionally a barrier layer deposited on the substrate film, which serves as an electrical isolator or as a diffusion barrier to prevent any constituent of the substrate to diffuse there through, an electrically conductive back contact layer, a p-type absorber layer, comprised of a copper-zinc-tin alloy further comprising at least one chalcogen and having chemical formula $Cu_xZn_ySn_zS_a$ with x being from 1.5 to 2.5, y being from 0.9 to 1.5, z being from 0.5 to 1.1 and a being from 3.8 to 4.2, or having chemical formula $Cu_xZn_ySn_zS_aSe_b$ with x being from 1.5 to 2.5, y being from 0.9 to 1.5, z being from 0.5 to 1.1, a being from 0.1 to 4.2 and b being from 0.1 to 4.2, at least one n-type buffer layer and at least one window layer. Further, a grid layer may be provided for electrical contact.

Very often the so-called substrate configuration is applied where the stacking of the various thin films starts with a base substrate and a back contact. In contrast, the superstrate configuration starts with a base substrate and a light transparent conductive front contact. The substrate configuration is considered here. The first layer deposited on the substrate is the back contact, or, alternatively, the base substrate is the back contact itself, this base substrate being supposed to have very low resistivity. Thereon, a semiconductor layer is deposited which has a relatively small band gap (the p-type layer). Thereon, a thin and heavily doped n-type layer is deposited which forms the junction and has a larger band gap. An antireflective and electrically conductive layer, which is called the window layer, is then coated on the junction. Finally a front contact being in the form of a thin grid, is formed, so that the junction is as less shadowed as possible by the front contact. As an example, the front contact grid of the cells elaborated in this work covers less than 5% of the cell area.

The copper-zinc-tin alloy layers containing at least one chalcogenide are semiconductors, more preferably p-type semiconductors, and may thus advantageously be used to manufacture a thin film solar cell. Such solar cells profit from the photoelectric effect produced in a junction between such p-type semiconductor with another n-type semiconductor like n-type CdS once light is irradiated to this junction. Hence, an open circuit voltage or short circuit current occurs.

Figure 2:
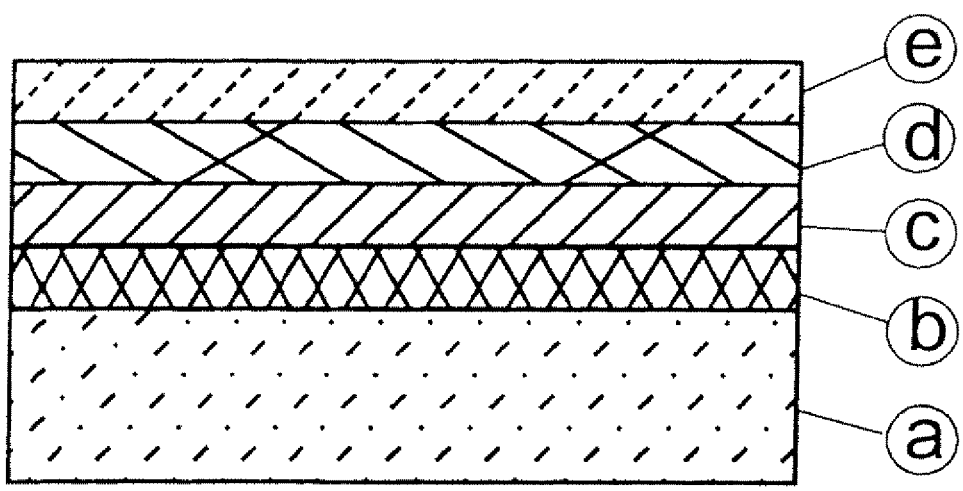
FIG. 2 shows a schematic layer structure of a glass substrate (a) being coated with a back contact (molybdenum layer) (b) and a sandwich layer consisting of a copper monolayer deposited by electroless deposition (c), an electrodeposited tin monolayer (d) and an electrodeposited zinc monolayer (e)
Figure 3:
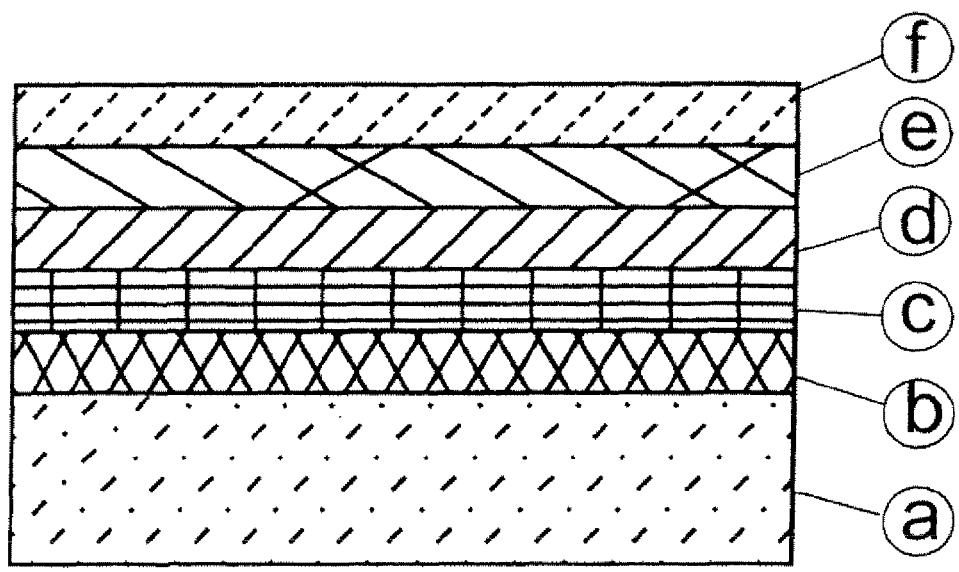
FIG. 3 shows a schematic layer structure of a glass substrate (a) being coated with a back contact (molybdenum layer) (b), an adhesion promotor layer (electrodeposited Ni—Pd layer) (c) and a sandwich layer consisting of an electrodeposited tin monolayer (d), an electrodeposited zinc monolayer (e) and an electrodeposited copper monolayer (f)

To manufacture such thin film solar cell an electrically conductive substrate like a metal sheet or a glass substrate being provided with an electrically conductive layer (back contact) is first provided with a layer of the copper-zinc-tin alloy containing the at least one chalcogenide. This layer serves as the absorber layer since it absorbs the light irradiated to the solar cell. Such structure is shown in FIGS. 1 through 3, the difference being that FIG. 1 contains such chalcogenide containing alloy layer and FIGS. 2 and 3 comprise sandwich layers of copper, zinc and tin. Further, FIG. 3 additionally comprises an adhesion promotor layer which helps to stabilize the chalcogenide containing sandwich layer on the glass substrate. Further, the sequence of monolayers in FIGS. 2 and 3 is different.

Figure 4:
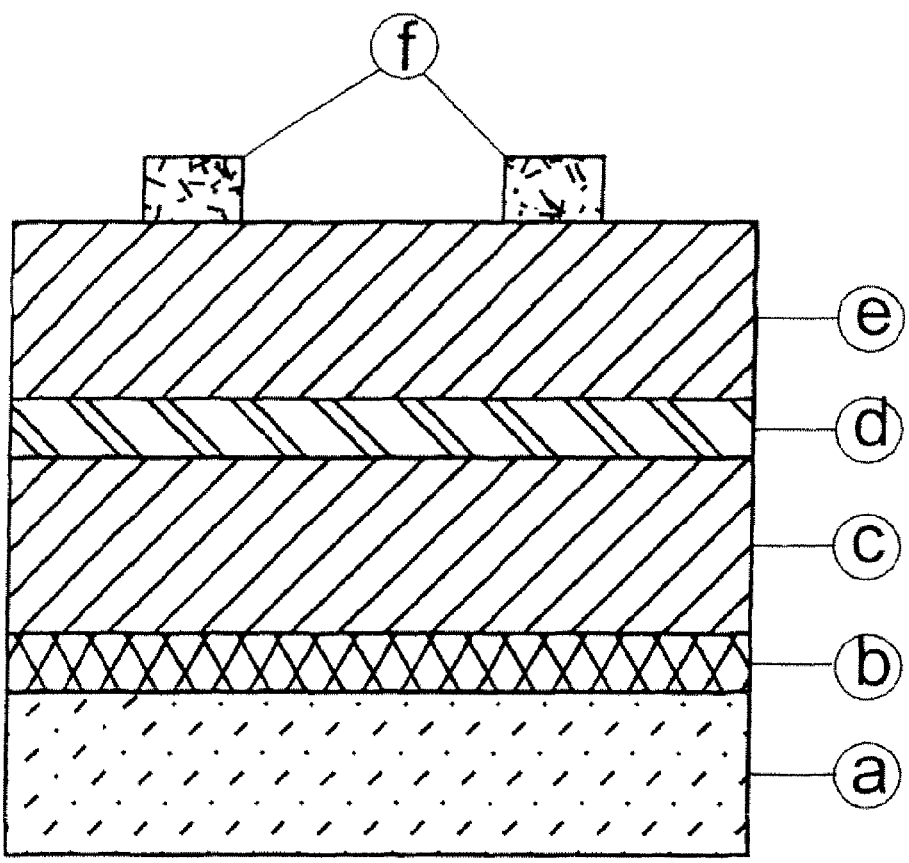
FIG. 4 shows a schematic structure of a thin film solar cell comprised of a glass substrate (a), a back contact (molybdenum layer) (b), an absorber layer (CZTS or CZTSe or CZTSSe) (c), a buffer layer (e.g., CdS) (d), a TCO/window layer (e.g., ZnO) (e) and a front grid contact (e.g., aluminium) (f)
Figure 5:
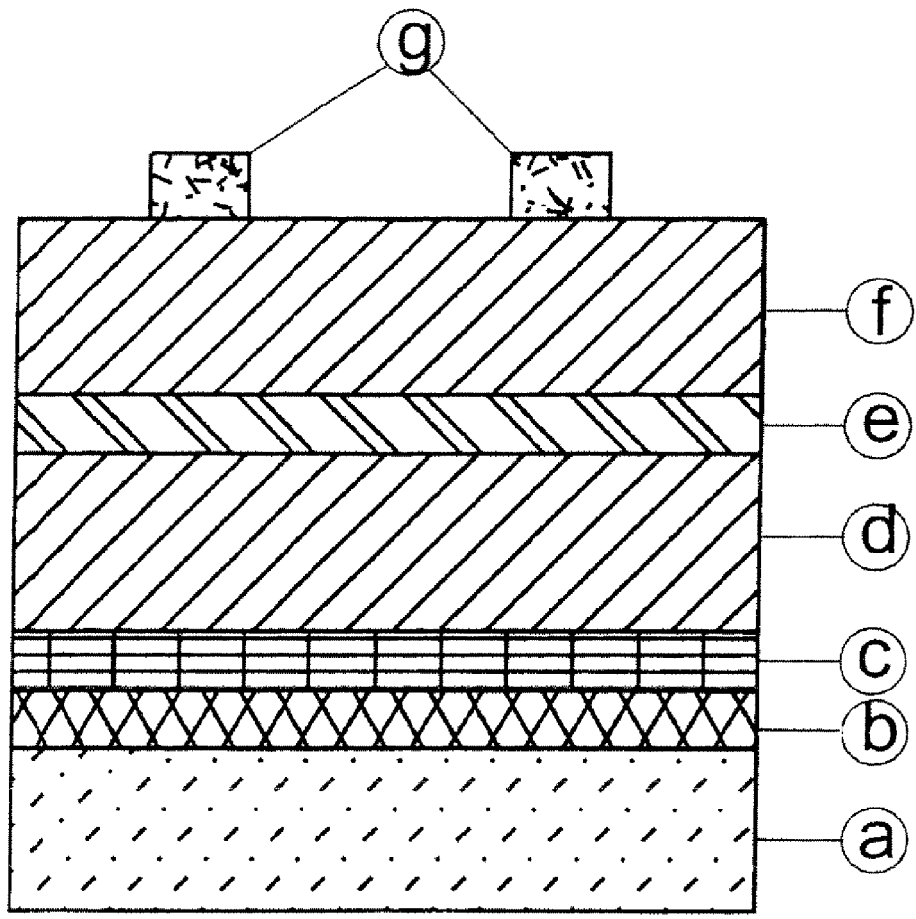
FIG. 5 shows a schematic structure of a thin film solar cell comprised of a glass substrate (a), a back contact (molybdenum layer) (b), an adhesion promotor layer (electrodeposited Pd—Ni layer) (c), an absorber layer (CZTS or CZTSe or CZTSSe) (d), a buffer layer (e.g., CdS) (e), a TCO/window layer (e.g., ZnO) (f) and a front grid contact (e.g., aluminium) (g)

Further deposition of a so-called buffer layer onto the absorber layer creates the junction required to generate the photoelectric effect once light is irradiated onto the solar cell. Such structure is shown in FIGS. 4 and 5. These structures further comprise a TCO/window layer and a front grid as an electrical contact. FIGS. 4 and 5 differ from each other in that FIG. 5 additionally comprises an adhesion promotor layer.

More specifically, the thin film solar cell may comprise:
a substrate layer which is either electrically conductive or non-conductive and which is furthermore either flexible or rigid;
optionally, a barrier layer which serves either as an electrical isolator or as a diffusion barrier to prevent diffusion of any constituent of the substrate material into the absorber layer deposited thereon;
an electrically conductive back contact layer which is preferably made from molybdenum;
the p-type absorber layer made from $Cu_xZn_ySn_zS_a$ (1.5<x<2.5; 0.9<y<1.5; 0.5<z<1.1; 3.8<a<4.2), or $Cu_xZn_ySn_zS_aSe_b$ (1.5<x<2.5; 0.9<y<1.5; 0.5<z<1.1; 0.1<a<4.2; 0.1<b<4.2) obtained by any method described herein above to prepare such alloy;
at =east one n-type buffer layer;
one or more window layers.

In order to prepare the layers in accordance with the present invention the substrate surface to receive such layers will normally be subjected to a process of pre-cleaning same prior to metallization. The substrates may be treated before plating with wet-chemical processes developed by the applicant or with any other cleansing chemicals, in order to remove any grease, dirt dust or oxide from the surface. A standard pre-cleaning process is described in Table 1:

TABLE 1

Standard pre-cleaning process

| Bath Name | Treatment Time [s] | Temperature [° C.] | Remarks |
| --- | --- | --- | --- |
| Uniclean ® *) 399 | 180 | 70 | |
| Uniclean ® *) 260 | 30 | 45 | |
| Uniclean ® *) 675 | 300 | Room Temperature | Ultrasonic Activation |

*) Trade Mark of Atotech Deutschland, DE

Uniclean® 399 is a mild alkaline, slightly foaming cleaner, which contains carbonate, silicates, phosphates, tensides and the biodegradable chelating agent gluconate. This bath is designed to remove mineral oils, polish and grind residues and pigment impurities for all metals.

Uniclean® 260 is a weak alkaline sodium hydroxide electrolytic cleaner, having electric conductivity, for the use for cathodic or for anodic degreasing.

Uniclean® 675 is an acidic activation agent for universal use. This cleaner contains sodium hydrogensulfate and sodium fluoride.

After having cleaned the substrate, the copper-zinc-tin alloy or the sandwich layer may be deposited to the substrate.

In the following Examples, numerous specific details are set forth in order to provide a thorough understanding of the present invention. It will be understood, however, to one skilled in the art, that the present invention may be practiced without some or all of these specific details:

EXAMPLES

Example 1

Deposition of a Copper-Zinc-Tin Sandwich Layer

In a first embodiment of the fourth aspect of the invention, a stack of electroless copper, electrodeposited tin and electrodeposited zinc (from the bottom/back contact to the top of the cell) was formed:

First, an electroless copper may be deposited using commercially available chemicals, e.g., Printoganth® MV Plus and/or Noviganth® TU (both names being trade marks of Atotech Deutschland). Both products are electroless copper baths based on tartrate as the complexing agent. The solution make-up was performed according to the instruction manual of the baths in a 5l beaker. The solution was agitated with air and by using a magnetic stirrer. It was heated on a hot plate to the working temperature at slightly above 30° C.

A molybdenum coated glass substrate was used to be plated clamped by using a copper wire as a holder. The sample was immersed into the electrolyte and electroless plating was initiated by applying a short (3 s) 3 V pulse between the sample holder and a copper wire anode. The sample was then treated for a period of time sufficient to achieve the desired layer thickness.

Then, tin was electroplated from a commercially available chemical plating bath, Stannopure® HSM (trade mark of Atotech Deutschland). This composition is an acidic methane sulfonic acid (MSA) electrolyte. Thus, pure tin was deposited.

Then, zinc was electroplated from a Zylite® HT (trade mark of Atotech Deutschland) electrolyte using a soluble zinc anode. Zylite® HT is a mild acid chloride zinc electrolyte which contains zinc chloride, potassium chloride, boric acid and additives.

For both, zinc and tin electroplating, the following experimental setting was the same: The electrolyte was contained in a polypropylene (PP) tank and was continuously filtered through a 10 µm filter. The anodes were enveloped in PP bags. The process was run at room temperature. A stainless steel sample holder was used. Sample movement was provided by hand or by motor.

A stack of monolayers of copper, zinc and tin was obtained.

Example 2

Deposition of a Copper-Zinc-Tin Sandwich Layer on an Adhesion-Promoted Glass Substrate In a second embodiment of the fourth aspect of the invention, a stack of electrodeposited palladium or palladium-nickel alloy, electrodeposited copper, electrodeposited tin and electrodeposited zinc (from the bottom/back contact to the top of the cell) was formed:

Thin layers of electrodeposited palladium (Pallacor®: trade mark of Atotech Deutschland) or of palladium-nickel alloy (Palnilux®: trade mark of Atotech Deutschland) were used as an adhesion promotor for the subsequent electrodeposition of tin, zinc and copper. Pallacor® is a neutral electrolyte for the deposition of palladium layers up to 10 µm. Palnilux® is an ammonia containing electrolyte which provides bright Pd—Ni (Pd 80% Ni 20%) layers. Both baths were operated according to the operation manuals.

The thickness of the adhesion promotor was in the range of 30 nm. The deposition time was 20 s. Tape test proved that both deposits had very strong adherence to molybdenum. Hence, especially Pd—Ni was used to further deposit tin, zinc and copper.

Deposition of tin and zinc was performed according to Example 1. Electrodeposition of copper was performed using the alkaline copper bath described in Example 1, but by applying a constant cathodic current to the substrate.

Example 3

Sulfurization of the Copper-Zinc-Tin Sandwich Layer

Thereafter the $Cu_xZn_ySn_z$ ($1.5<x<2.5$; $0.9<y<1.5$; $0.5<z<1.1$) alloy layer obtained was sulfurized using an RTP (Rapid Thermal Processing) furnace. The main part of the furnace is the quartz glass tube having a quartz lamp system, which surrounds same for optimal heating. This is a hot wall configuration. The maximum heating rate was 10 K/s (<1100° C.). The furnace was equipped with different gas supply valve, vacuum system and a PC control unit. A cooling trap and a scrubber system were installed within the exhaust to eliminate any toxic compound like $H_2S$ or $H_2Se$ from the waste gas. A water cooling system protected sensible parts like seals, flanges etc.

An SiC covered graphite box was installed in the centre of the glass tube. It served as a substrate carrier and was equipped with different caps, which either have a sufficiently large hole to grant the necessary gas exchange or seal of the box interior to keep the necessary partial pressure of the evaporating compounds in this box. The graphite box was connected with a main thermo couple of the temperature control unit. This optimized configuration ensured a homogenous temperature distribution at the substrate surface of less than ±2 K.

The final vacuum pressure was limited by a rotary vane pump at $\leq 10^{-3}$ mbar. The different gas supply valves allowed the connection of either inert gas like nitrogen (flow rates: 0-3600 l/h) as well as process gases like $H_2S$ ($Ar/H_2S$-5 vol.-%). The flow rates of the process gases were controlled using a mass flow controller of up to 500 sccm.

Sulfurization was performed as follows:

Annealing of the $Cu_xZn_ySn_z$ ($1.5<x<2.5$; $0.9<y<1.5$; $0.5<z<1.1$) sandwich precursor took place in the RIP furnace described above.

Sulfurization was carried out using elemental sulfur (powder/flakes 99.99+%). The precursor samples were placed together with the elemental sulfur into the closed graphite box whereas the sulfur was placed in a small groove near the box walls homogeneously distributed around the samples. The amount of sulfur varied according to the desired pressure and was usually in the range of 30 mg up to 2 g.

The individual steps of sulfurization are shown in Table 2.

TABLE 2

Sulfurization steps using elemental sulfur

| No. | Step | Time [min] | Heating Rate [K/min] | Final Temperature [° C.] | Gas | Flow Rate | Pressure | Remarks |
|---|---|---|---|---|---|---|---|---|
| 1 | Evacuation | 5 | 0 | RT *) | — | 0 | $\leq 10^{-3}$ mbar | Precleaning |
| 2 | Gas Rinse | 5 | 0 | RT *) | Nitrogen | 3600 l/h | Normal Pressure | |
| 3 | Evacuation | 5 | 0 | RT *) | — | 0 | $\leq 10^{-3}$ mbar | |
| 4 | Gas Rinse | 5 | 0 | RT *) | Nitrogen | 3600 l/h | Normal Pressure | |
| 5 | Heating | 1 | 600 | 550 | Nitrogen/Sulfur | 100 sccm | Normal Pressure | Sulfurization |
| 6 | heating | 60/120 | 0 | 550 | Nitrogen/Sulfur | 100 sccm | Normal Pressure | |
| 7 | Cooling | 60 | Physical limited | RT *) | Nitrogen | 500 sccm | Normal Pressure | Cooling |

*) RT: room temperature

Steps 1 through 4 were necessary to clean the gas ambience in the quartz glass tube and graphite box. These steps were important to reduce oxygen and water/moisture.

The heating rate was 10 K/s until the final temperature of 550° C. was reached. This rate was a compromise between reaching as soon as possible the necessary sulfur partial pressure and the kinetics of the formation and recrystallization of the $Cu_xZn_ySn_zS_a$ ($1.5<x<2.5$; $0.9<y<1.5$; $0.5<z<1.1$; $0.1<a<4.2$) layer.

Formation of $Cu_xZn_ySn_zS_a$ ($1.5<x<2.5$; $0.9<y<1.5$; $0.5<z<1.1$; $0.1<a<4.2$) was linked with an expansion of the layer. For a sufficient sulfurization and cure of the layers the final temperature of 550° C. was held for at least 60 min. A homogeneous crystal structure was observed within 120 min reaction time.

After the sulfurization step cooling started. The flow rate of nitrogen was increased to 500 sccm for a faster exchange of the gas atmosphere. Until approximately 350° C. the graphite box containing the samples was allowed to cool down without further cooling devices. After that the cooling was supported by the fan system of the furnace.

The recrystallized absorber layers were further processed to a thin film solar cell using standard procedures known from the copper indium gallium selenide system.

Example 4

Manufacture of a Thin Film Solar Cell

An n-type CdS buffer layer was deposited using chemical bath deposition from an electrolyte according to Table 3.

TABLE 3

| Deposition of n-type CdS | |
|---|---|
| Cadmium Sulfate | 0.0124 mol/l |
| Ammonia | 1.1 mol/l |
| Thiourea | 0.222 mol/l |
| Deposition Time | 7 min |
| Bath Temperature | 60° C. |

After the buffer layer had been deposited, the solar cell devices were completed by a ZnO:Ga/i-ZnO window bi-layer prepared by rf-magnetron sputtering. For single cells the ZnO:Ga layer was approximately 400 nm and i-ZnO approximately 100 nm thick. Finally, a Ni—Al metal grid was deposited through an aperture mask on the single cells as a front contact. The contacting grid consisted of a 10 nm thick Ni layer on a 1 µm thick Al layer.

Samples processed according to the foregoing Example exhibited efficiencies of up to 1.2% (AM 1.5)

Examples 5-14

Deposition of $Cu_xZn_ySn_z$ Alloy Layers

In a further preferred embodiment of the present invention a $Cu_2ZnSn$ alloy layer was obtained in a single process step using a galvanic bath containing metal salts of copper, zinc and tin.

The $Cu_xZn_ySn_z$ (1.5<x<2.5; 0.9<y<1.5; 0.5<z<1.1) layer was deposited directly via electroplating on a commercially available molybdenum coated soda lime substrate delivered by Saint Gobain as shown in FIG. 1.

After the plating process the $Cu_xZn_ySn_z$ (1.5<x<2.5; 0.9<y<1.5; 0.5<z<1.1) layer undergoes a sulfurization treatment to form the $Cu_xZn_ySn_zS_a$ (1.5<x<2.5; 0.9<y<1.5; 0.5<z<1.1; 3.8<a<4.2) film. Sulfurization of the $Cu_2ZnSn$ layer is known from literature and for example described in H. Katagiri of al., ibid. (2005).

A $Cu_xZn_ySn_z$ (1.5<x<2.5; 0.9<y<1.5; 0.5<z<1.1) layer was prepared on molybdenum coated soda lime glass by contacting the substrate with a bath containing:

95 g/l $Na_3PO_4 \cdot 12\ H_2O$, 67 g/l $Na_2HPO_4 \cdot 7\ H_2O$, 13.4 g/l Na oxalate, 1.26 g/l $Na_2SO_3$, 1.2 g/l $Cu_2P_2O_7 \cdot 3\ H_2O$, 0.76 g/l $Zn_2P_2O_7 \cdot 3\ H_2O$, 7.4 g/l $Na_2SnO_3$, 0.25-0.5 ml/l Disponile FES 993 (wetting agent) and 35 mM of an additive, these additives being those described herein above as i1) through i3) and i5) through i10). In one experiment no additive was used (Comparative Example). pH of the solution was 11.2-11.8. The density thereof was 1.09 g/cm³. During deposition temperature was 45° C.

The stoichiometries (Table 4) obtained for certain plating potential is listed for the mentioned additives above. The enhancement of tin co-deposition reached almost 30 at-% in comparison to the basic electrolyte without any additives.

TABLE 4

Alloy composition determined by XRF measurements; layers were obtained from potentiostatic deposition (−1.8 V vs. Ag/AgCl) on Pt tip electrodes using different additives

| Compound | Alloy Composition [at.-%] | | |
|---|---|---|---|
| | Cu | Sn | Zn |
| No Additive (Comp. Ex.) | 52.6 | 16.7 | 30.7 |
| i1 | 50.9 | 20.3 | 28.8 |
| i2 | 56.1 | 18.0 | 25.9 |
| i3 | 49.8 | 17.1 | 33.1 |
| i5 | 51.5 | 21.1 | 27.4 |
| i6 | 54.1 | 21.3 | 24.6 |
| i7 | 56.7 | 19.4 | 23.9 |
| i8 | 52.0 | 17.7 | 30.4 |
| i9 | 48.1 | 19.9 | 32.0 |
| i10 | 36 | 38 | 26 |

The influence of plating temperature on alloy composition (Table 5) is shown for the basic electrolyte (Comparative Example). The tendency of increasing tin content at higher bath temperature exists with the same slope for all mentioned additives above.

TABLE 5

Alloy composition determined by XRF Measurements; layers were obtained from potentiostatic deposition (−1.8 V vs Ag/AgCl) on Pt tip electrodes for different temperatures

| No Additive | Alloy Composition | | |
|---|---|---|---|
| | Cu | Sn | Zn |
| 25° C. | 52.6 | 16.7 | 30.7 |
| 40° C. | 50.9 | 20.3 | 28.8 |
| 50° C. | 47.1 | 25.7 | 27.2 |
| 70° C. | 40.1 | 36.0 | 23.9 |

The sulfur source was selected from the group listed below:
Thiosulfate
Thiourea and the derivatives thereof
Thiosulfonic acids
Di(thiosulfonic) acids The following sulfur sources are preferred: benzene sulfonic acid and benzene di(thionosutfonic) acid.

Selenosulfate [$SeSO_3^{2-}$] which is an analogon of thiosulfate was applied as a selenium source. It was used in concentrations of up to 5 mM added to the above mentioned electrolyte.

The solution of sodium selenosulfite was prepared by dissolving elemental selenium (7.9 g/l) in a sodium sulfite (126 g/l)/sodium hydroxide (40 g/l) solution and heating the mixture obtained for about 1 h at approximately 90° C. Sulfite ions, present in excess, prevent the decomposition of selenosulfite solution.

A variation of selenium contents is shown for different $SeSO_3^{2-}$ electrolyte concentrations (Table 6).

TABLE 6

Alloy composition determined by XRF measurements; layers were obtained from potentiostatic deposition (−1.2 V vs Ag/AgCl) on Pt tip electrodes for different $SeSO_3^{2-}$ concentrations

| $C_{Se}$: $C_1$ < $C_2$ < $C_3$ | Alloy Composition [at.-%] | | | |
|---|---|---|---|---|
| | Cu | Sn | Zn | Se |
| $C_1$ | 65.6 | 7.1 | 7.7 | 19.6 |
| $C_2$ | 45.2 | 15.9 | 15.6 | 23.3 |
| $C_3$ | 15.9 | 21.1 | 20.7 | 42.3 |

Figure 6:
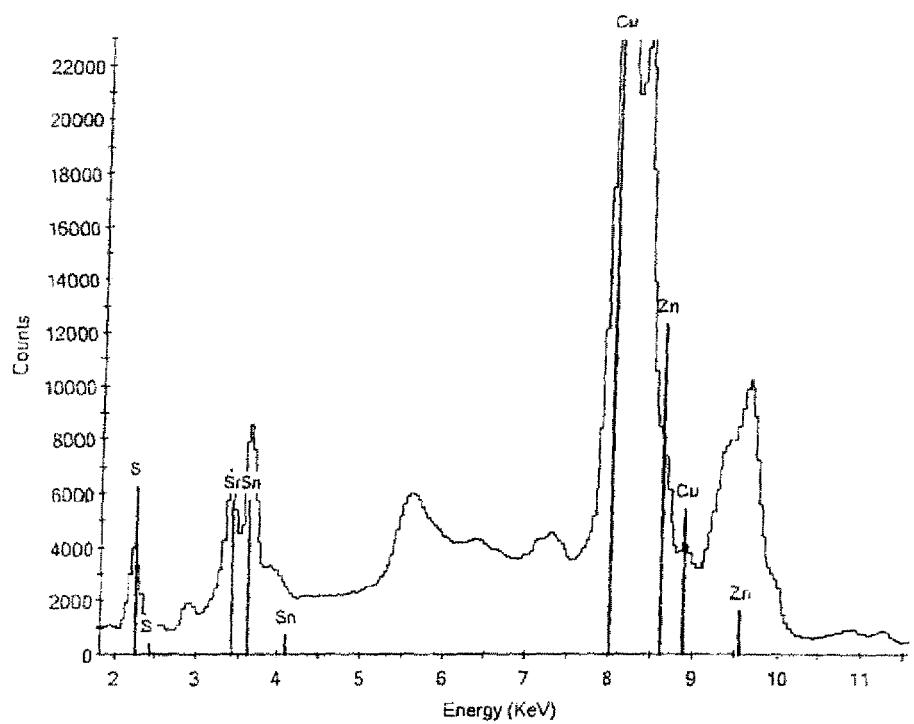
FIG. 6 shows an XRF spectrum obtained after deposition of $Cu_2ZnSn$ using an electrolyte containing a sulfur source; the layers were obtained by potentiostatic deposition (−1.2 V vs Ag/AgCl) on a glassy carbon tip electrode.
Figure 7:
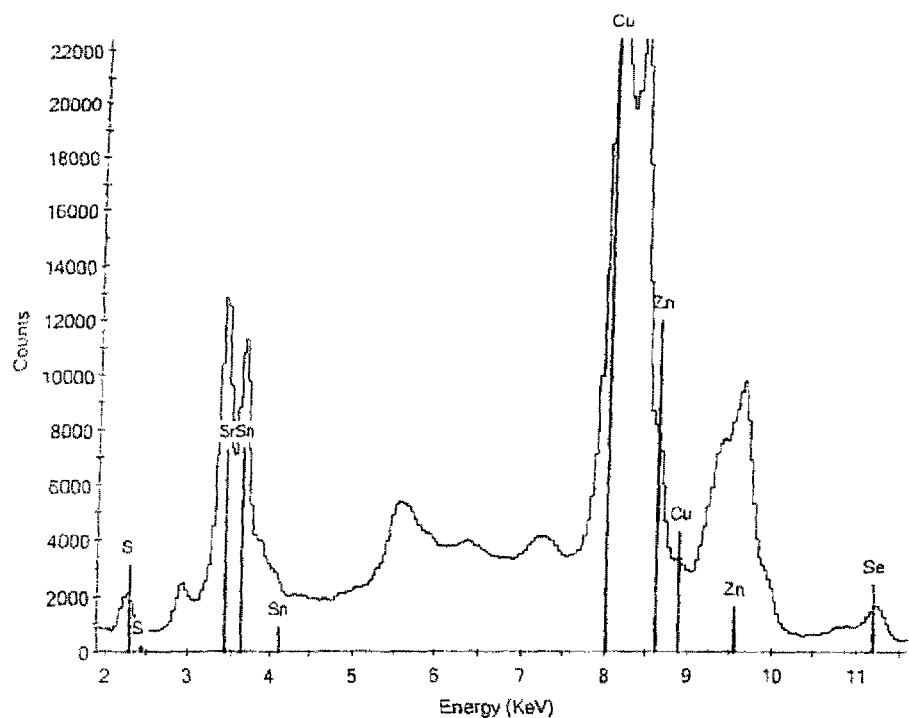
FIG. 7 shows as XRF spectrum obtained after deposition of Cu$_2$ZnSn using an electrolyte containing a selenium source; the layers were obtained from potentiostatic deposition (−1.2 V vs Ag/AgCl) on a glassy carbon tip electrode.

Electrochemical co-deposition of sulfur could not be quantified by the XRF method at present. Nevertheless, it can be clearly confirmed from XRF spectra that the incorporation of sulfur and optional sulfur combined with selenium was obtained (FIGS. 6 and 7).

Thereafter the $Cu_xZn_ySn_z$ (1.5<x<2.5; 0.9<y<1.5; 0.5<z<1.1) layer was sulfurized using an RTP furnace.

The electrodeposited $Cu_xZn_ySn_z$ (1.5<x<2.5; 0.9<y<1.5; 0.5<z<1.1) samples were placed in the graphite box. The individual steps of sulfurization are shown in Table 7.

TABLE 7

Sulfurization steps for Cu$_2$ZnSn precursor

| No. | Step | Time [min] | Heating Rate [K/min] | Final Temperature [° C.] | Gas | Flow Rate | | Pressure | Remarks |
|---|---|---|---|---|---|---|---|---|---|
| 1 | Evacuation | 5 | 0 | RT *) | — | 0 | | ≤10$^{-3}$ mbar | Precleaning |
| 2 | Gas Rinse | 5 | 0 | RT *) | Nitrogen | 3600 | l/h | Normal Pressure | |
| 3 | Evacuation | 5 | 0 | RT *) | — | 0 | | ≤10$^{-3}$ mbar | |
| 4 | Gas Rinse | 5 | 0 | RT *) | Nitrogen | 3600 | l/h | Normal Pressure | |
| 5 | Heating | 17 | 10 | 200 | Ar/H$_2$S (5 vol.-%) | 300 | sccm | Normal Pressure | Sulfurization |
| 6 | Heating | 175 | 2 | 550 | Ar/H$_2$S (5 vol.-%) | 100 | sccm | Normal Pressure | |
| 7 | Heating | 120 | 0 | 550 | Ar/H$_2$S (5 vol.-%) | 100 | sccm | Normal Pressure | |
| 8 | Cooling | 125 | -2 | 300 | Nitrogen | 100 | sccm | Normal Pressure | Cooling |
| 9 | Cooling | 60 | Physical limited | RT *) | Nitrogen | 100 | sccm | Normal Pressure | |

The sulfurization program described above (Table 7) was based on a paper of H. Katagiri et al., "Solar Cell Without Environmental Pollution by Using CZTS Thin Films", Proceedings of the 3$^{rd}$ World Conference on Photovoltaic Energy Conversion, Osaka, 2874 (2003), and was slightly adapted according to the present needs.

Steps 1 through 4 were necessary to clean the reactor chamber. These steps are important to reduce oxygen and water/moisture residues.

Sulfurization of the ternary Cu$_2$ZnSn alloy is linked with a volume expansion of the layer. Best recrystallization results were obtained using the settings as depicted above.

The higher flow of Ar/H$_2$S in the first 17 minutes of the sulfurization steps (Step 5) led to a faster gas exchange in the recipient.

After formation of the Cu$_2$ZnSnS$_4$ layer the sample was cooled down at different cooling rates (Steps 8 and 9). The first cooling rate of -2 K/min until 300° C. attained was very slow and helped to avoid cracks in the layer. Thereafter the cooling rate was determined by the physical laws and depended on the temperature difference of the sample, graphite box and the environment, respectively. It was supported by the fan system of the RTP furnace.

The recrystallized absorber layers were further processed to a thin film solar cell using standard procedures known from the copper indium gallium selenide system (see above)

The thin film solar cell obtained as such showed an efficiency of 0.1%.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. A metal plating composition for the deposition of a copper-zinc-tin alloy, said alloy additionally containing at least one chalcogen, the metal plating composition comprising at least one copper plating species, at least one zinc plating species, at least one tin plating species, at least one complexing agent and at least one chalcogen plating species,
   wherein the metal plating composition additionally comprises at least one additive, selected from the group consisting of disubstituted benzene compounds having general chemical formula I:

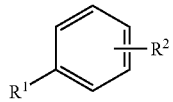

I wherein R$^1$ and R$^2$ are the same or different, are selected independently from the group consisting of OH, SH, NR$^3$R$^4$, CO—R$^5$, COOR$^5$, CONR$^3$R$^4$, COSR$^5$, SO$_2$OR$^5$, SO$_2$R$^5$, SO$_2$NR$^3$R$^4$ and the salts thereof or have the aforementioned meanings and form a common condensation chain;
   with R$^3$ and R$^4$ being the same or different, being selected independently from the group consisting of H and alkyl; and
   with R$^5$ being selected from the group consisting of H, alkyl and hydroxyalkyl, and wherein the metal plating composition has a pH in the range of greater than 10.5 to about 12.

2. The metal plating composition of claim 1, wherein R$^1$ and R$^2$ are selected from the group consisting of COOH, COOCH$_2$CH$_2$OH, COOCH$_2$CH$_3$, COOCH$_3$, NH$_2$, CHO or together form a moiety CO—NH—SO$_2$, said moiety being bonded to positions in ortho-orientation to the benzene ring.

3. The metal plating composition of claim 1, wherein the copper-zinc-tin alloy is a $Cu_xZn_ySn_zCh1_aCh2_b$ alloy, with Ch1 being a first chalcogen, Ch2 being a second chalcogen and wherein x is from 1.5 to 2.5, y is from 0.9 to 1.5, z is from 0.5 to 1.1, a is from 0 to 4.2 and b is from 0 to 4.2.

4. The metal plating composition of claim 1, wherein the copper, zinc and tin plating species are present in the composition at a molar ratio of copper:zinc:tin=1:0.1-10:0.1-4.

5. The metal plating composition of claim 1, wherein the copper, zinc and tin plating species are present in the composition at a molar ratio of copper:zinc:tin=1:2-8:0.4-1.

6. The metal plating composition of claim 1, wherein the copper plating species are copper phosphates or copper pyrophosphates and wherein the zinc plating species are zinc phosphates or zinc pyrophosphates.

7. The metal plating composition of claim 1, wherein the tin plating species are tin stannates.

8. The metal plating composition of claim 1, wherein at least one complexing agent is selected from the group consisting of oxalate, citrate and gluconate compounds.

9. The metal plating composition of claim 1, wherein the composition further comprises a buffer system.

10. The metal plating composition of claim 9, wherein the buffer system comprises hydrogenphosphate/phosphate.

11. The metal plating composition of claim 3, wherein a>0, Ch1 is S and at least one chalcogen plating species is a sulfur plating species, said sulfur plating species being selected from the group consisting of thiosulfates, thiosulfonic acids, di(thiosulfonic) acids, sulfur sulfides, thiourea and the derivatives thereof, organic disulfides, organic polysulfides, colloidal elemental sulfur and compounds forming colloidal elemental sulfur.

12. The metal plating composition of claim 3, wherein b>0, Ch2 is Se and at least one chalcogen plating species is a selenium plating species, said selenium plating species being selected from the group consisting of selenates, selenosulfites, diselenides and polyselenides.

13. A method of depositing of a copper-zinc-tin alloy, said alloy additionally containing at least one chalcogen, said method comprising contacting a substrate and an anode with the metal plating composition of claim 1 and flowing an electric current between said substrate and the anode.

14. The method of claim 13, further comprising sulfurizing the copper-zinc-tin alloy by contacting same with a sulfur plating species.

15. The method of claim 14, wherein the sulfur plating species is selected from the group consisting of elemental sulfur and a reducing atmosphere containing a sulfur compound.

16. The method of claim 13, further comprising depositing a selenium monolayer onto the alloy.

17. The method of claim 13, further comprising selenizing the copper-zinc-tin alloy by contacting same with a reducing atmosphere containing a selenium compound.

18. The metal plating composition of claim 1, wherein the metal plating composition has a pH in the range of from about 11.2 to about 12.

19. The metal plating composition of claim 1, wherein the metal plating composition does not contain a noble metal from the group consisting of silver, gold, palladium, iridium, ruthenium, rhodium, and platinum.

\* \* \* \* \*

UNITED STATES PATENT AND TRADEMARK OFFICE
CERTIFICATE OF CORRECTION

PATENT NO. : 9,263,609 B2
APPLICATION NO. : 12/302072
DATED : February 16, 2016
INVENTOR(S) : Holger Kuhnlein, Jorg Schulze and Torsten Voss It is certified that error appears in the above-identified patent and that said Letters Patent is hereby corrected as shown below:

Specification

Column 1, Line 53, change "at al." to -- et al. --
Column 1, Line 65, change "at al." to -- et al. --
Column 1, Line 66, change "at al." to -- et al. --
Column 2, Line 19, change "at al." to -- et al. --
Column 2, Line 25, change "at al." to -- et al. --
Column 2, Line 28, change "at al." to -- et al. --
Column 2, Line 30, change "at al." to -- et al. --
Column 2, Line 37, change "at al." to -- et al. --
Column 2, Line 38, change "at al." to -- et al. --
Column 2, Line 49, change "at al." to -- et al. --
Column 3, Line 38, change "et at," to -- et al. --
Column 4, Line 52, after "kesterite" insert -- (a= --
Column 4, Line 52, change "CIS" to -- CTS --
Column 15, Line 62, change "Zytite" to -- Zylite --
Column 19, Line 31, change "=east" to -- least --
Column 22, Line 8, change "RIP" to -- RTP --
Column 23, Line 50, change "of al.," to -- et al., --
Column 24, Line 42, change "di(thionosutfonic)" to -- di(thionosulfonic) --

Signed and Sealed this
Twenty-eighth Day of June, 2016

Michelle K. Lee
*Director of the United States Patent and Trademark Office*